United States Patent [19]
Nishibayashi et al.

[11] Patent Number: 5,600,156
[45] Date of Patent: Feb. 4, 1997

[54] DIAMOND SEMICONDUCTOR DEVICE WITH P-I-N TYPE MULTILAYER STRUCTURE

[75] Inventors: Yoshiki Nishibayashi; Tadashi Tomikawa; Shin-ichi Shikata, all of Itami, Japan

[73] Assignee: Sumitomo Electric Industries, Ltd., Japan

[21] Appl. No.: 303,112

[22] Filed: Sep. 8, 1994

[30] Foreign Application Priority Data

Sep. 10, 1993 [JP] Japan ..................... 5-226235

[51] Int. Cl.⁶ ............... H01L 31/0312; H01L 29/861; H01L 29/167; H01L 31/075
[52] U.S. Cl. ............... 257/77; 257/104; 257/655; 257/656
[58] Field of Search ................ 257/77, 104, 655, 257/656

[56] References Cited

FOREIGN PATENT DOCUMENTS

| 0445998 | 9/1991 | European Pat. Off. ............ 257/77 |
| 0457508 | 11/1991 | European Pat. Off. ............ 257/77 |
| 4-293272 | 10/1992 | Japan ............................ 257/77 |

OTHER PUBLICATIONS

M. I. Emerets, "Semiconducting diamond", Semiconductor Science and Technology, vol. 6, No. 6, Jun. 1991 London GB, pp. 439–444.

*Primary Examiner*—Steven H. Loke
*Attorney, Agent, or Firm*—Pennie & Edmonds

[57] ABSTRACT

A diamond semiconductor device of the present invention comprises an n-type diamond layer to which an n-type dopant is doped at high concentration so that metal conduction dominates, a p-type diamond layer to which a p-type dopant is doped at high concentration so that metal conduction dominates, and a high resistance diamond layer formed between the n-type diamond layer and the p-type diamond layer. Here, the thickness and the doping concentration of the high resistance diamond layer are values at which semiconductor conduction dominates. Then, in a case that an applied voltage is forward bias, electrons are injected from the n-type region to the p-type region through the conduction band of the high resistance region, and holes are injected from the p-type region to the n-type region through the valance band of the high resistance region, so that a current flows. On the other hand, in a case that an applied voltage is reverse bias because substantially no dopant is doped to the high resistance diamond layer, carriers are not present, so that a large current does not flow. Therefore, semiconductor conduction dominates as carrier conduction in pn junction and the rectification can be obtained, so that with the control of carriers, good diode characteristics or transistor characteristics can be achieved.

22 Claims, 18 Drawing Sheets

Fig.11
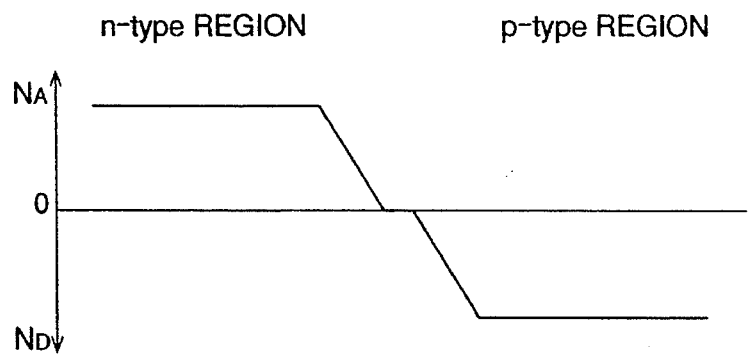
Fig.12
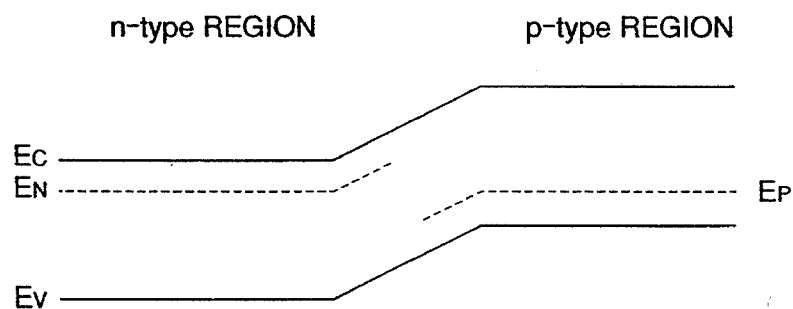
Fgi.13
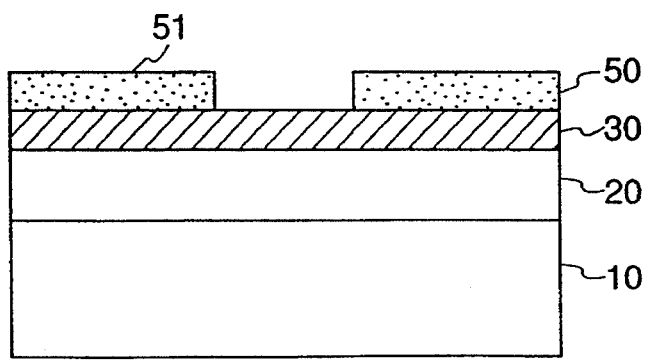

DIAMOND SEMICONDUCTOR DEVICE WITH P-I-N TYPE MULTILAYER STRUCTURE

BACKGROUND OF THE INVENTION

1. Field of the Invention

The present invention relates to a diamond semiconductor device which is formed as a diode, a transistor, or other semiconductor devices using various conduction type dopant doped diamond as a semiconductor material.

2. Related Background Art

Semiconductor devices which operate stably under high temperature, high radiation or other environment, and semiconductor devices which can operate with high powered output have been expected. As a material for such semiconductor devices, diamond has been drawing attention.

Diamond is doped with III-element or V-element, which results in p-type semiconductor or n-type semiconductor, respectively. Further, diamond has a large energy gap of about 5.5 eV, which means that an intrinsic region, at which carrier movement is uncontrollable, is not present below 1400° C. Therefore, with use of diamond as semiconductor, a semiconductor device which is stable thermally, that is, a semiconductor device which can operate at high temperature may be formed.

Diamond is stable chemically and has a heat conductivity of 20 W/cm·K which is ten times larger than that of silicon and is superior in heat radiation. Further, diamond has a small permitivity of 5.5, a large breakdown voltage of $5\times10^6$ V/cm and a large carrier mobility; an electron mobility of 2000 cm$^2$/V·s and a hole mobility of 2100 cm$^2$/V·s at 300K. Therefore, the diamond semiconductor is also expected to be used at high frequency and high output power.

The techniques relating to such a diamond semiconductor and a diamond semiconductor device are described fully in "Japanese Patent Laid-Open No. SHO 59-208821 (208821/1984)", "Japanese Patent Laid-Open No. SHO 59-213126 (213126/1984)", and "Japanese Patent Laid-Open No. SHO 62-70295 (70295/1987)".

SUMMARY OF THE INVENTION

However, because carbon composing diamond has a small radius and a large atomic density, a dopant to be doped to diamond is limited to an atom having a small radius such as boron, nitrogen or the like. Therefore, the conventional diamond semiconductor device has a problem that the metal conduction dominates in pn junction, which makes the control of carriers harder. Accordingly, the diamond semiconductor device which practically operates as a pn junction diode, a pnp junction transistor or an npn junction transistor has not been manufactured.

Then, the present invention was achieved in consideration of the above problems, and an object of the present invention is to provide a diamond semiconductor device which has diode characteristics or transistor characteristics.

A diamond semiconductor device of the present invention comprises an n-type diamond layer to which an n-type dopant is doped at high concentration so that metal conduction dominates, a p-type diamond layer to which a p-type dopant is doped at high concentration so that metal conduction dominates, and a high resistance diamond layer formed between the n-type diamond layer and the p-type diamond layer.

Here, it is preferable that the thickness and the doping concentration of the high resistance diamond layer are values at which semiconductor conduction dominates between the n-type diamond layer and the p-type diamond layer.

The n-type dopant is preferably nitrogen. In this case, it is preferable that the nitrogen concentration of the n-type diamond layer is $1\times10^{17}$cm$^{-3}$ or above, and that the nitrogen concentration of the high resistance diamond layer is less than $1\times10^{17}$cm$^{-3}$. Alternatively, it is preferable that the nitrogen concentration of the n-type diamond layer is $1\times10^{19}$cm$^{-3}$ or above, and that the nitrogen concentration of the high resistance diamond layer is less than $1\times10^{19}$cm$^{-1}$.

Further, the p-type dopant is preferably boron. In this case, it is preferable that the boron concentration of the p-type diamond layer is $1\times10^{17}$cm$^{-3}$ or above, and that the boron concentration of the high resistance diamond layer is less than $1\times10^{17}$cm$^{-3}$. Alternatively, it is preferable that the boron concentration of the p-type diamond layer is $1\times10^{19}$cm$^{-3}$ or above, and that the boron concentration of the high resistance diamond layer is less than $1\times10^{19}$cm$^{-3}$.

Furthermore, the thickness of the high resistance diamond layer is preferably within a range of 30–3000 nm.

In the above-described diamond semiconductor device of the present invention, the n-type diamond layer and the p-type diamond layer are formed by doping an n-type dopant and a p-type dopant at high concentration, respectively, so that the donor level and the acceptor level degenerate and are present near the conduction band and the valance band, respectively. Therefore, metal conduction dominates as carrier conduction.

The inventors of the present application thought that as the thickness and the doping concentration of the high registance diamond layer, which is formed between the n-type diamond layer and the p-type diamond layer, were set to predetermined values, semiconductor conduction dominated in pn junction and the control of carriers was possible.

In the case that an applied voltage is forward bias, electrons are injected from the n-type diamond layer to the p-type diamond layer through the conduction band of the high resistance diamond layer, and holes are injected from the p-type diamond layer to the n-type diamond layer through the valance band of the high resistance diamond layer, so that a current flows. On the other hand, in the case that the applied voltage is reverse bias, because the dopant is doped to the high resistance diamond layer at low concentration or substantially no dopant is doped thereto, carriers are rarely present, so that a large current does not flow.

Therefore, semiconductor conduction dominates in pn junction as carrier conduction because of the large reverse withstand voltage, so that the rectification can be obtained. Accordingly, semiconductor conduction dominates in pn junction and carriers can be controlled, so that good diode characteristics or transistor characteristics can be achieved.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become

BRIEF DESCRIPTION OF THE DRAWING

FIG. 11 is a graph showing the distribution of a doping concentration in pn junction of a diamond semiconductor in a case that a thickness of a high resistance diamond layer is within a predetermined range, and that a central non-doped region in which both an n-type dopant and a p-type dopant are not doped is formed and two inclining doping regions in which an n-type doping concentration concentration $N_A$ and a p-type doping concentration $N_D$ gradually decreases from an n-type diamond layer side or a p-type diamond layer side are formed although both an n-type dopant and a p-type dopant are not partially doped to the high resistance diamond layer.

FIG. 12 is a graph showing an energy diagram corresponding to the distribution of a doping concentration of FIG. 11.

FIG. 13 is a sectional view showing the structure of a diamond semiconductor device according to the preparation example of the present invention.

DETAILED DESCRIPTION OF THE PREFERRED EMBODIMENTS

Figure 1:
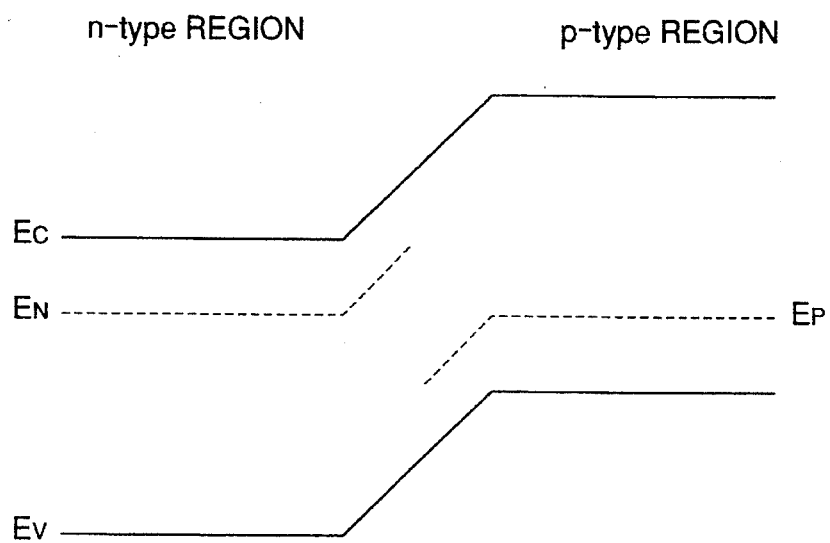
FIG. 1 is a graph showing an energy diagram to explain pn junction of a diamond semiconductor not comprising a high resistance diamond layer.

Referring to FIG. 1–FIG. 31, the structure and function of the embodiments according to the present invention will be explained hereinbelow. In the description of the drawings, the same components are represented by the same reference numerals, and the repetitive description on the same components is omitted. The dimension of the drawings does not always match with the actual one.

FIG. 1 is an energy diagram to explain pn junction of a diamond semiconductor not comprising a high resistance diamond layer. FIG. 1 shows a state of thermal equilibrium with a zero applied voltage in which an n-type diamond layer is directly coupled with a p-type diamond layer.

In a case of using nitrogen as an n-type dopant, a donor level $E_N$ measured from a conduction band $E_C$ is about 1–2 eV, which is very deep. Further, in a case of using boron as a p-type dopant, an acceptor level $E_P$ measured from a valence band $E_V$ is 0.37 eV, which is shallow compared with the donor level $E_N$.

In a case that an applied voltage is forward bias, electrons are injected from the n-type region to the p-type region, and holes are injected from the p-type region to the n-type region, so that a current flows. On the other hand, in a case that an applied voltage is reverse bias, tunnel effect through the donor level $E_N$ and the acceptor level $E_P$ or avalanche occurs due to the high electric field generated near the pn junction, so that a large current flows.

Therefore, metal conduction dominates as carrier conduction in pn junction and rectification cannot be obtained, since a reverse withstand voltage has become small.

However, in the diamond semiconductor device of the present invention, the n-type diamond layer and the p-type diamond layer are formed by doping an n-type dopant and a p-type dopant at high concentration, respectively, so that the donor level and the acceptor level degenerate and are present around the conduction band and the valence band. Consequently, metal conduction dominates as carrier conduction. Further, a high resistance diamond layer having a predetermined thickness and a predetermined doping concentration is formed between the n-type diamond layer and the p-type diamond layer.

Figure 2:
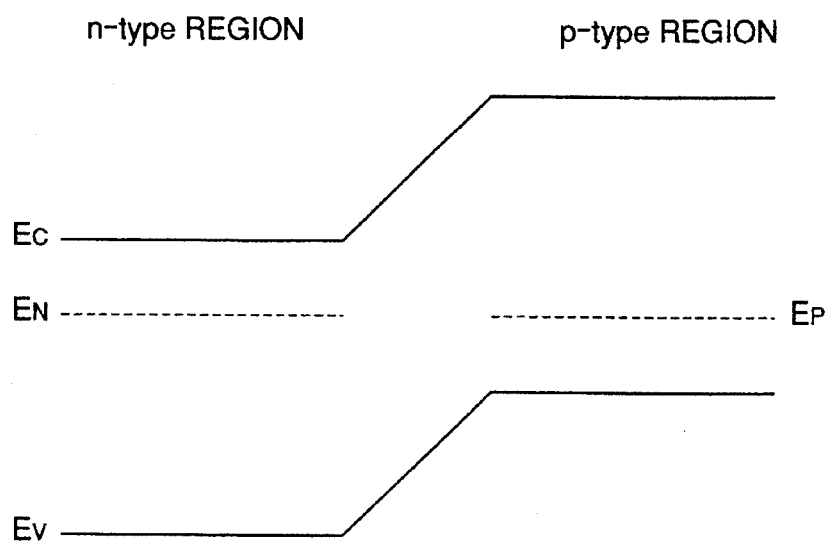
FIG. 2 is a graph showing an energy diagram to explain pn junction of a diamond semiconductor comprising a high resistance diamond layer in a diamond semiconductor device of the present invention.

FIG. 2 is an energy diagram to explain a pn junction of a diamond semiconductor having a high resistance diamond layer in a diamond semiconductor device of the present invention. Here, the n-type diamond layer and the p-type diamond layer sandwiching the high resistance diamond layer and a state of thermal equilibrium, with a zero applied voltage are shown.

In a case that an applied voltage is forward bias, electrons are injected from the p-type region into the p-type region through the conduction band which is a high resistance region, and the holes are injected from the p-type region to the n-type region through the valence band which is a high resistance region, so that a current flows. On the other hand, in a case that an applied voltage is reverse bias, carriers are rarely present in the high resistance diamond layer since the high resistance diamond layer has a low doping concentration, or has no doping concentration; consequently, a large current does not flow.

Therefore, semiconductor conduction dominates in pn junction as carrier conduction and rectification can be obtained, since the reverse withstand voltage has become large. Accordingly, semiconductor conduction dominates in pn junction to control carriers, so that excellent diode characteristics or transistor characteristics can be achieved.

FIG. 3, FIG. 5, FIG. 7, FIG. 9 and FIG. 11 are graphs each showing the distribution of a doping concentration in pn junction of a diamond semiconductor having a high resistance diamond layer. FIG. 4, FIG. 6, FIG. 8, FIG. 10 and FIG. 12 are energy diagrams corresponding to the distribution of a doping concentration shown in the preceding figure.

Figure 3:
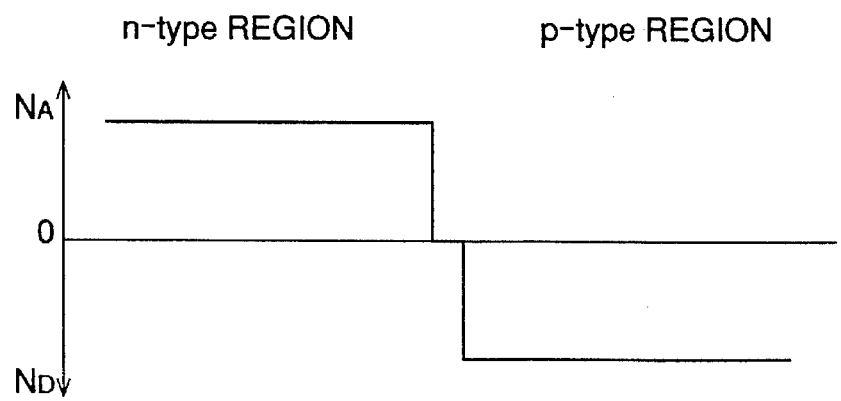
FIG. 3 is a graph showing the distribution of a doping concentration in pn junction of a diamond semiconductor in a case that a thickness of a high resistance diamond layer is very small and that an n-type doping concentration $N_A$ and a p-type doping concentration $N_D$ are substantially zero.
Figure 4:
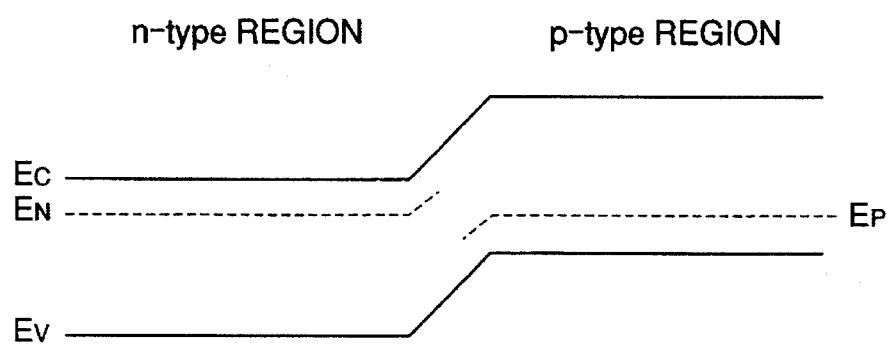
FIG. 4 is a graph showing an energy diagram corresponding to the distribution of a doping concentration of FIG. 3.

As shown in FIG. 3 and FIG. 4, in the case that the thickness of the high resistance diamond layer is very small and that the n-type doping concentration $N_A$ and the p-type doping concentration $N_D$ are substantially zero, the tunnel effect occurs through the donor level $E_N$ and the acceptor level $E_P$ near the pn junction against the reverse biasing applied voltage. Consequently, a current flows in both the forward direction and the reverse direction, that is, this pn junction does not have the rectification.

Figure 5:
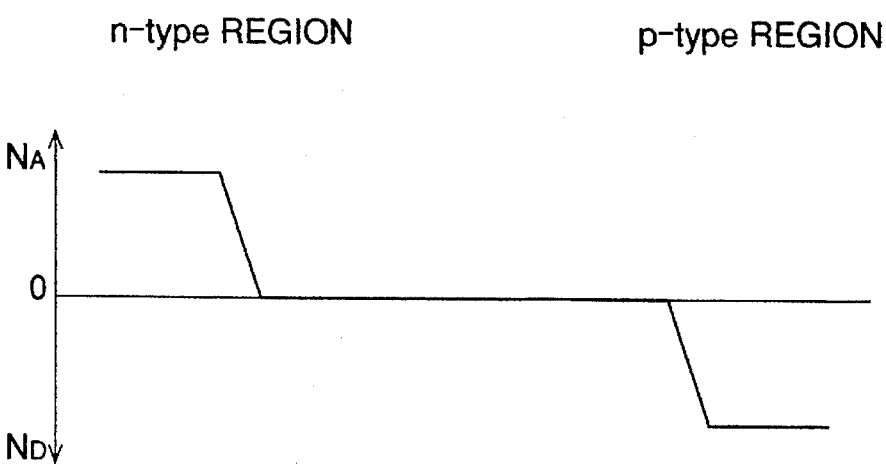
FIG. 5 is a graph showing the distribution of a doping concentration in pn junction of a diamond semiconductor in a case that a thickness of a high resistance diamond layer is very large and larger than a mean free path of an electron or a hole, and that an n-type doping concentration $N_A$ and a p-type doping concentration $N_D$ are substantially zero.
Figure 6:
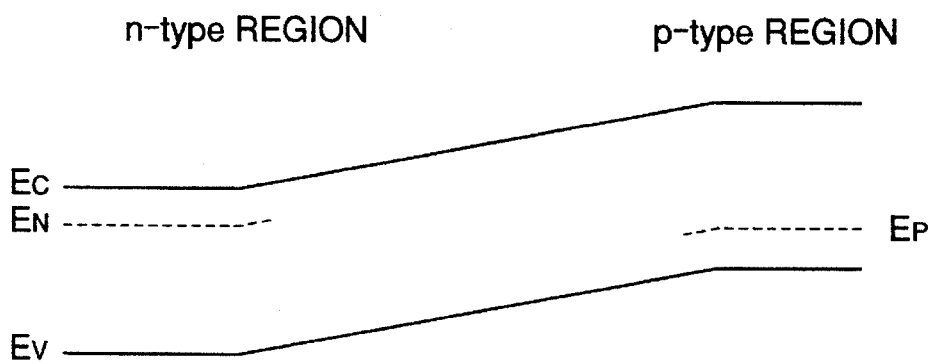
FIG. 6 is a graph showing an energy diagram corresponding to the distribution of a doping concentration of FIG. 5.

As shown in FIG. 5 and FIG. 6, in the case that the thickness of the high resistance diamond layer is much larger than a mean free path of an electron or a hold, and that the n-type doping concentration $N_A$ and the p-type doping concentration $N_D$ are substantially zero, the region near pn junction becomes high resistance against a forward biasing voltage. Consequently, a current does not flow both the forward direction and the reverse direction, that is, this pn junction does not have the rectification.

Figure 7:
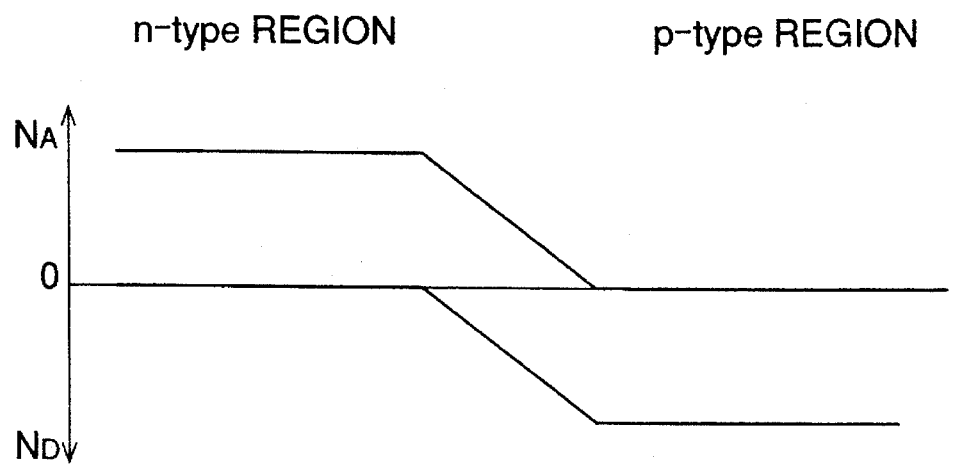
FIG. 7 is a graph showing the distribution of a doping concentration in pn junction of a diamond semiconductor in a case that a thickness of a high resistance diamond layer is within a predetermined range, and that an n-type dopant and a p-type dopant are both doped to the high resistance diamond layer and an n-type doping concentration $N_A$ and a p-type doping concentration $N_D$ gradually decrease from an n-type diamond layer side or a p-type diamond layer side.
Figure 8:
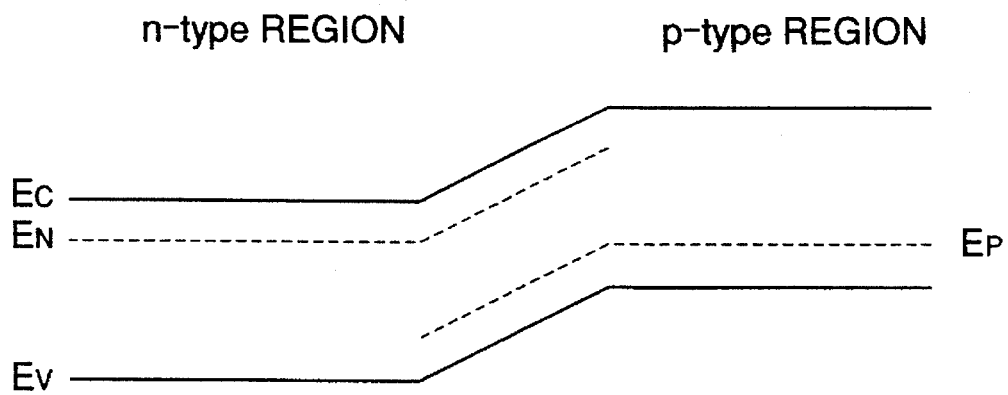
FIG. 8 is a graph showing an energy diagram corresponding to the distribution of a doping concentration of FIG. 7.

However, as shown in FIG. 7 and FIG. 8, in a case that a thickness of a high resistance diamond layer is within a predetermined range, and that an n-type dopant and a p-type dopant are both doped to the high resistance diamond layer and the n-type doping concentration $N_A$ and the p-type doping concentration $N_D$ gradually decreases from an n-type diamond layer side or a p-type diamond layer side, the pn junction becomes pn junction of a diamond semiconductor device of the present invention. Therefore, because of the above reasons, the rectification can be obtained.

Figure 9:
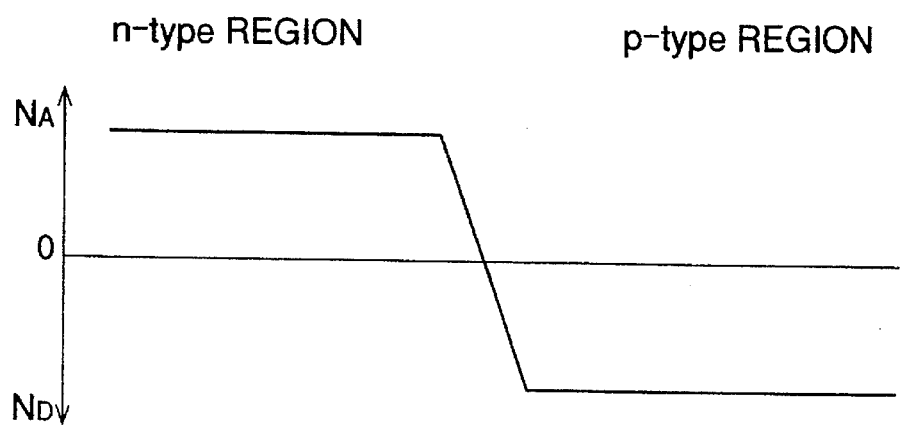
FIG. 9 is a graph showing the distribution of a doping concentration in pn junction of a diamond semiconductor in a case that a thickness of a high resistance diamond layer is within a predetermined range, and that two inclining doping regions in which an n-type doping concentration $N_A$ and a p-type doping concentration $N_D$ gradually decrease from an n-type diamond layer side or a p-type diamond layer side are formed although both an n-type dopant and a p-type dopant are not partially doped to the high resistance diamond layer.
Figure 10:
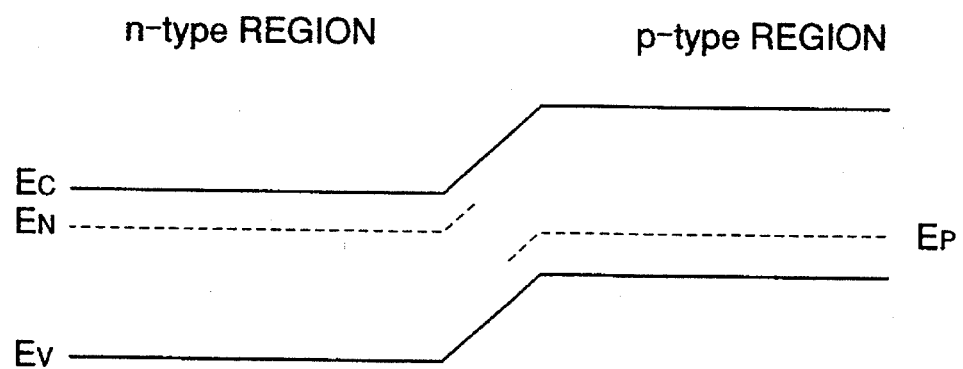
FIG. 10 is a graph showing an energy diagram corresponding to the distribution of a doping concentration of FIG. 9.

As shown in FIG. 9 and FIG. 10, in a case that the thickness of the high resistance diamond layer is within a predetermined range, and that two inclining doping regions in which the n-type doping concentration $N_A$ and the p-type doping concentration $N_D$ gradually decrease from an n-type diamond layer side or an p-type diamond layer side are formed although both an n-type dopant and a p-type dopant are not partially doped to the high resistant diamond layer, the pn junction becomes pn junction of a diamond semiconductor device of the present invention. Therefore, because of the above reasons, the rectification can be obtained.

Further, as shown in FIG. 11 and FIG. 12, in a case that the thickness of the high resistance diamond layer is within a predetermined range, and that a central non-doped region to which both the n-type dopant and the p-type dopant are not doped is formed and two inclining doping regions in which the n-type doping concentration $N_A$ and the p-type doping concentration $N_D$ gradually decreases from the n-type diamond layer side or the p-type diamond layer side are formed although both the n-type dopant and the p-type dopant are not partially doped to the high resistance diamond layer, the pn junction becomes pn junction of a diamond semiconductor device of the present invention. Therefore, because of the above reasons, the rectification can be obtained.

Preparative Example

FIG. 13 shows a cross section of the structure of a diamond semiconductor device according to the preparative example of the present invention.

An i-type layer 20 and an n-type layer 30 are deposited on a substrate 10 in order by a microplasma CVD method. Electrode layers 50 and 51 are grown selectively on a part of the exposed surface of the n-type layer 30.

Here, the substrate 10 is an insulating substrate made of artificial monocrystalline diamond (Ib type) synthesized by high pressure or a semiconductor substrate made of silicon. The i-type layer 20 is deposited on the substrate 10 at a temperature of about 850° C. and a pressure of 40 Torr while microwave having an output power of 300 W is applied to a mixed gas containing $H_z$ of 100 sccm flow rate and $CH_4$ of 6 sccm flow rate to discharge at high frequency. The i-type layer 20 is made of high resistance diamond and has a thickness of about 2 μm.

Further, the n-type layer 30 is formed under the same condition as the i-type layer 20 with 7 sccm flow rate $NH_3$ added to the mixed gas. The n-type layer 30 is made of low resistance diamond and has a thickness of about 1 μm and nitrogen concentration of $1\times10^{17}$ cm$^{-3}$ or above, preferably $1\times10^{19}$ cm$^{-3}$ or above. Furthermore, electrode layers 50 and 51 are made of Ti/Mo/Au.

Note that in the i-type layer 20, the nitrogen concentration and the boron concentration are less than the nitrogen concentration of the n-type layer 30, and that the distribution of nitrogen and boron does not have to be uniform in a direction of the thickness.

Next, the function of the preparative example will be explained.

The n-type layer 30 is formed by doping nitrogen as an n-type dopant at high concentration, so that the donor level degenerates and are present near the conduction band. Therefore, metal conduction dominates as carrier conduction, so that the low resistance conductivity can be obtained at room temperature.

Next, the experiment conducted with respect to the preparative example will be explained.

First, after only the i-type layer 20 was deposited on the substrate 10, the conductivity was measured. The resistivity detected was greater than $10^{10}$Ω·cm, which was enormous to be specified, as a result of this mesurement.

Next, after the n-type layer 30 was formed on the i-type layer 20, the conductivity was measured. The hole effect was detected, which meant that the carriers were electrons, and the conduction type of the n-type layer 30 made of nitrogen doped diamond was confirmed, as a result of this mesurement.

Note that in the experiment of the preparation example, in the case that the i-type layer 20 and the n-type layer 30 were made of monocrystalline diamond semiconductor formed on a monocrystalline diamond substrate and in the case that they were made of polycrystalline diamond semiconductor formed on a silicon substrate, the same results were obtained.

Comparative Example

Figure 14:
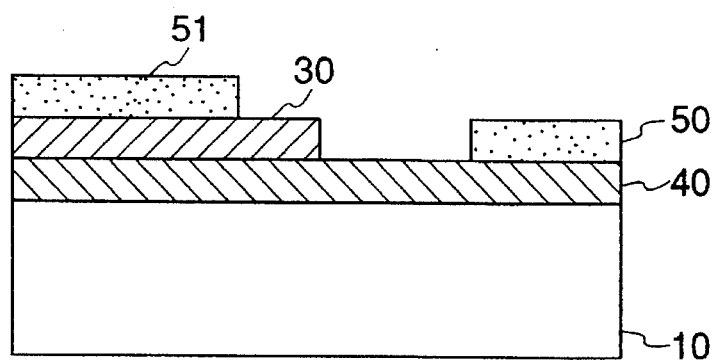
FIG. 14 is a sectional view showing the structure of a diamond semiconductor device according to the comparative example of the present invention.

FIG. 14 is a sectional view showing a diamond semiconductor device according to the comparative example of the present invention.

A p-type layer 40 and an n-type layer 30 are deposited on a substrate 10 in order by a microplasma CVD method. The n-type layer 30 is grown selectively on a predetermined position of the exposed surface of the p-type layer 40. Further, electrode layers 50 and 51 are grown selectively on a part of the exposed surface of the p-type layer 40 and the n-type layer 30, respectively.

Here, the substrate 10, the n-type layer 30 and the electrode layers 50 and 51 are formed under the same condition as the preparative example, but the p-type layer 40 is formed under the same condition as the n-type layer 30 but $NH_3$ added to the mixed gas is replaced with $B_2H_6$ of 2 sccm flow rate (hydrogen dilution: 1000 ppm). The p-type layer 40 is made of low resistance diamond and has a thickness of about 1 μm and a boron concentration of $1\times10^{17}$cm$^{-3}$ or above, preferably $1\times10^{19}$cm$^{-3}$ or above.

Next, the function of the comparative example will be explained.

The n-type layer 30 and the p-type layer 40 are formed by doping nitrogen and boron as an n-type dopant and a p-type dopant at high concentration, respectively, so that the donor level and the acceptor level degenerate and are present near the conduction band and the valence band, respectively. Therefore, metal conduction dominates as carrier conduction, so that the low resistance conductivity can be obtained even at room temperature.

Accordingly, the carrier conduction is not controlled, so that the diamond semiconductor device can not obtain the diode characteristics as a semiconductor device constituting a two-terminal diode.

Next, the experiment conducted with respect to the comparative example will be explained.

The diamond semiconductor device was formed in the same manner as the comparative example except the nitrogen concentration of the n-type layer 30 being varied in a certain range, and the electrical characteristics were measured.

The change in the rectification ratio corresponding to the nitrogen concentration from $1\times10^{17}$cm$^{-3}$ to $1\times10^{19}$cm$^{-3}$ of the n-type layer 30 is shown in Table 1. Hereinbelow, the recification ratio represents a ratio $I_S/I_V$ of a forward current $I_S$ to a reverse current $I_V$ corresponding to a applied voltage of 10V.

TABLE 1

| Nitrogen Concentration of n-type Layer (cm$^{-3}$) | Reverse Current $I_v$ (nA) | Forward Current$_s$ (mA) | Rectification Ratio $I_s/I_v$ ($\times 10^7$) |
| --- | --- | --- | --- |
| $1 \times 10^{17(*)}$ | 0.05 | 0.5 | 1 |
| $1 \times 10^{18}$ | 0.005 | 0.2 | 4 |
| $3 \times 10^{18}$ | 0.008 | 0.3 | 3.8 |
| $1 \times 10^{19}$ | 0.01 | 1.0 | 10 |

*: Only this sample is measured at the substrate temperature of 600° C.

It can be studied as a result of this mesurement that when the nitrogen concentration of the n-type layer 30 is $1\times10^{17}$cm$^{-3}$ or above, the good rectification ratio can not be obtained. Accordingly, when the concentration of the n-type layer 30 is $1\times10^{17}$cm$^{-3}$ or above, the excellent diode is formed.

Note that in the experiment of the comparative example, in the case that the p-type layer 40 and the n-type layer 30 were made of monocrystalline diamond semiconductor formed on a monocrystalline diamond substrate and in the case that they were made of polycrystalline diamond semiconductor formed on a silicon substrate, the same results were obtained.

First Embodiment

Figure 15:
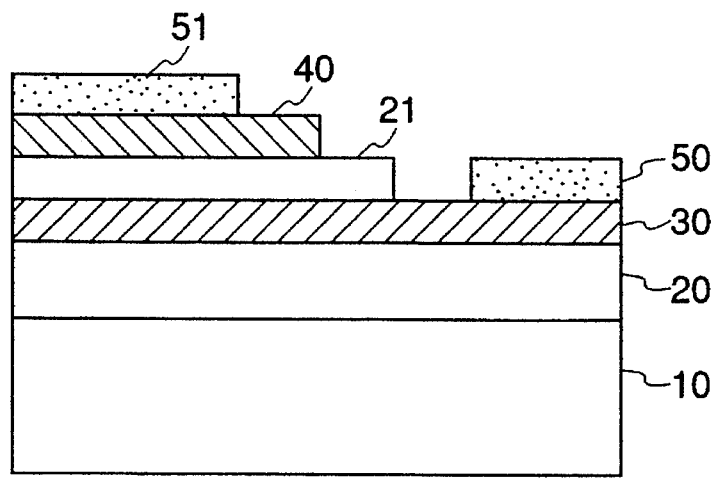
FIG. 15 is a sectional view showing the structure of a diamond semiconductor device according to the first embodiment of the present invention.

FIG. 15 is a sectional view showing the structure of a diamond semiconductor device according to the first embodiment of the present invention.

An i-type layer 20, an n-type layer 30, an i-type layer 21 and a p-type layer 40 are deposited on a substrate 10 in order by a microplasma CVD method. The i-type layer 21 is grown selectively on a predetermined position of the exposed surface of the n-type layer 30. Further, the p-type layer 40 is grown selectively on a predetermined position of the exposed surface of the i-type layer 21. Furthermore, electrode layers 50 and 51 are grown selectively on a part of the exposed surface of the n-type layer 30 and the p-type layer 40, respectively.

Here, the substrate 10, the i-type layer 20, the n-type layer 30 and the electrode layers 50 and 51 are formed under substantially the same condition as the preparative example, but the i-type layer 21 is formed under the same condition as the i-type layer 20, and the i-type layer 21 is made of high resistance diamond and has a thickness of 0.2–1 μm. Further, the p-type layer 40 is formed under the same condition as the i-type layer 20, with $B_2H_6$ of 2 sccm flow rate (hydrogen dilution: 1000 ppm) added to mixed gas. The p-type layer 40 is made of low resistance diamond and has a thickness of about 1 μm and a boron concentration of $1\times10^{17}cm^{-3}$ or above, preferably $1\times10^{19}cm^{-3}$ or above.

Note that in the i-type layers 20 and 21, the nitrogen concentration and the boron concentration are less than the nitrogen concentration of the n-type layer 30 and the boron concentration of the p-type layer 40, respectively and that the distribution of nitrogen and boron does not have to be uniform in a direction of the thickness.

Next, the function of the first embodiment will be explained.

The n-type layer 30 and the p-type layer 40 are formed by doping nitrogen and boron as an n-type dopant and a p-type dopant at high concentration, respectively, so that the donor level and the acceptor level degenerate and are present near the conduction band and the valence band, respectively. Consequently, metal conduction dominates as carrier conduction, the low resistance conductivity can be obtained even at room temperature.

The i-type layer 21 having a predetermined thickness is formed between the n-type layer 30 and the p-type layer 40. Therefore, in the case that the applied voltage is forward bias, electrons are injected from the n-type layer 30 to the p-type layer 40 through the conduction band of the i-type layer 21, and holes are injected from the p-type layer 40 to the n-type layer 30 through the valance band of the i-type layer 21, so that a current flows. On the other hand, in the case that the applied voltage is reverse bias, carriers are hardly present in the i-type layer 21 because the dopant is doped at low concentration or not doped, so that a large current does not flow.

Therefore, semiconductor conduction dominates as carrier conduction in pn junction, which can obtain the rectification, since the reverse withstand voltage has become large. Accordingly, carriers can be controlled in pn junction, so that diamond semiconductor device obtains the good diode characteristics as a semiconductor device constituting a two-terminal diode.

Next, the experiment conducted with respect to the first embodiment will be explained.

The diamond semiconductor device was formed in the same manner as the first embodiment except the nitrogen concentration of the n-type layer 30 and the thickness of the i-type layer 21 being varied in a certain range, and the electrical characteristics were measured.

First, the change in the rectification ratio corresponding to the thickness of 50–5000 nm of the i-type layer 21 in the case of the n-type layer 30 having a nitrogen concentration of $1\times10^{20}cm^{-3}$ is shown in Table 2.

TABLE 2

| Thickness of i-type Layer (nm) | Reverse Current $I_v$ (nA) | Forward Current $I_s$ (mA) | Rectification Ratio $I_s/I_v$ ($\times 10^7$) |
|---|---|---|---|
| 50 | 30 | 3 | 0.01 |
| 100 | 2 | 3 | 0.15 |
| 200 | 1 | 3 | 0.3 |
| 500 | 0.2 | 2 | 1 |
| 1000 | 0.08 | 0.1 | 0.13 |
| 5000 | less than 0.01 | less than 0.01 | — |

It can be studied as a result of this mesurement that when the thickness of the i-type layer 21 is 30–3000 nm, the excellent rectification ratio can be obtained.

Next, the change in the rectification ratio corresponding to the nitrogen concentration of $1\times10^{18}$–$1\times10^{21}cm^{-3}$ of the n-type layer 30 in the case of the i-type layer 21 having a thickness of 500 nm is shown in Table 3.

TABLE 3

| Nitrogen Concentration of n-type Layer ($cm^{-3}$) | Reverse Current $I_v$ (nA) | Forward Current $I_s$ (mA) | Rectification Ratio $I_s/I_v$ ($10^7$) |
|---|---|---|---|
| $1\times10^{18}$ | 0.008 | 0.02 | 0.24 |
| $3\times10^{18}$ | 0.01 | 0.08 | 0.8 |
| $1\times10^{19}$ | 0.01 | 0.2 | 2 |
| $3\times10^{19}$ | 0.1 | 1 | 1 |
| $1\times10^{20}$ | 0.2 | 2 | 1 |
| $1\times10^{21}$ | 0.5 | 5 | 1 |

It can be studied as a result of this mesurement that when the nitrogen concentration of the n-type layer 30 is $1\times10^{17}cm^{-3}$ or above, the good rectification ratio can be obtained.

Accordingly, when the thickness of the i-type layer 21 is within a range of 30–3000 nm, and the nitrogen concentration of the n-type layer 30 is $1\times10^{17}cm^{-3}$ or above, the excellent diode is formed.

Note that in the experiment of the first embodiment, in the case that the i-type layers 20 and 21, the n-type layer 30 and the p-type layer 40 were made of monocrystalline diamond semiconductor formed on a monocrystalline diamond substrate and in the case that they were made of polycrystalline diamond semiconductor formed on a silicon substrate, the same results were obtained.

Second Embodiment

Figure 16:
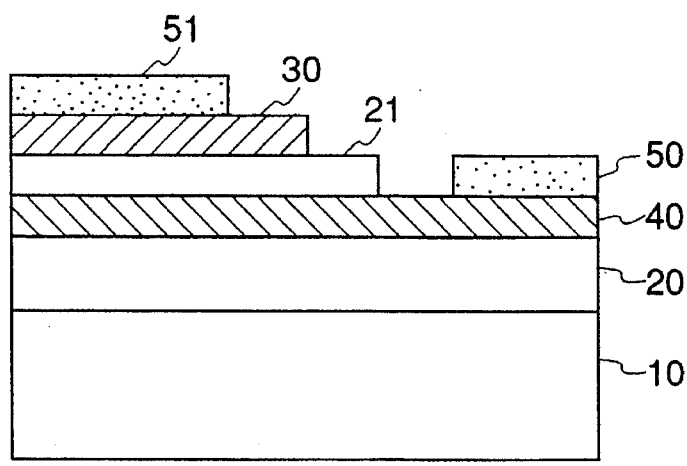
FIG. 16 is a sectional view showing the structure of a diamond semiconductor device according to the second embodiment of the present invention.

FIG. 16 is a sectional view showing the structure of a diamond semiconductor device according to the second embodiment of the present invention.

An i-type layer 20, a p-type layer 40, an i-type layer 21 and an n-type layer 30 are deposited on a substrate 10 in order by a microplasma CVD method. The i-type layer 21 is grown selectively on a predetermined position of the exposed surface of the p-type layer 40. The n-type layer 30 is grown selectively on a predetermined position of the exposed surface of the i-type layer 21. Furthermore, electrode layers 50 and 51 are grown selectively on a part of the exposed surface of the p-type layer 40 and the n-type layer 30, respectively.

Here, the substrate 10, the i-type layers 20 and 21, the p-type layer 40, the n-type layer 30 and the electrode layers 50 and 51 are formed under substantially the same condition as the first embodiment.

According to the above structure, the diamond semiconductor device of the present embodiment works in the same way as the first embodiment. Accordingly, semiconductor conduction dominates as carrier conduction and carriers can be controlled, so that the diamond semiconductor device obtains the good diode characteristics as a semiconductor device constituting a two-terminal diode.

Next, the experiment conducted with respect to the first embodiment will be explained.

The diamond semiconductor device was formed in the same manner as the second embodiment except the nitrogen concentration of the n-type layer 30 and the thickness of the i-type layer 21 being varied in a certain range, and the electrical characteristics were measured.

The change in the rectification ratio corresponding to the nitrogen concentration of $1\times10^{17}$–$1\times10^{21}\text{cm}^{-3}$ of the n-type layer 30 in the case of the i-type layer 21 having a thickness of 500 nm is shown in Table 4.

TABLE 4

| Nitrogen Concentration of n-type Layer (cm$^{-3}$) | Reverse Current (nA) | Forward Current (mA) | Rectification Ratio $I_s/I_v$ ($\times 10^7$) |
| --- | --- | --- | --- |
| $1 \times 10^{17}$ | 0.002 | 0.02 | 1 |
| $1 \times 10^{18}$ | 0.005 | 0.08 | 1.6 |
| $3 \times 10^{18}$ | 0.008 | 0.1 | 1.3 |
| $1 \times 10^{19}$ | 0.01 | 0.5 | 5 |
| $3 \times 10^{19}$ | 0.1 | 3 | 3 |
| $1 \times 10^{20}$ | 0.3 | 4 | 1.3 |
| $1 \times 10^{21}$ | 0.4 | 6 | 1.5 |

It can be studied as a result of this mesurement that as compared with the first embodiment, the good rectification ratio can be obtained.

Note that in the experiment of the second embodiment, in the case that the i-type layers 20 and 21, the p-type layer 40 and the n-type layer 30 were made of monocrystalline diamond semiconductor formed on a monocrystalline diamond substrate and in the case that they were made of polycrystalline diamond semiconductor formed on a silicon substrate, the same results were obtained.

Third Embodiment

Figure 17:
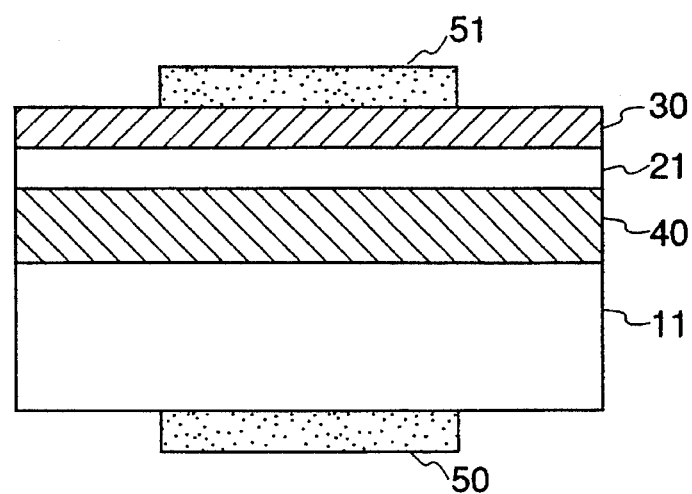
FIG. 17 is a sectional view showing the structure of a diamond semiconductor device according to the third embodiment of the present invention.

FIG. 17 is a sectional view showing the structure of a diamond semiconductor device according to the third embodiment of the present invention.

A p-type layer 40, an i-type layer 21 and an n-type layer 30 are deposited on a substrate 11 in order by a microplasma CVD method. Electrode layers 50 and 51 are grown selectively on a part of the back surface of the substrate 11 and the exposed surface of the n-type layer 30, respectively.

Here, the p-type layer 40, the i-type layer 21, the n-type layer 30 and the electrode layers 50 and 51 are formed under substantially the same condition as the second embodiment. Note that the substrate 11 is a p-type substrate made of artificial monocrystalline diamond having a boron concentration of $10^{20}\text{cm}^{-3}$ or a p-type substrate made of silicon having a resistivity of 0.1 Ω·cm or below.

According to the above structure, the diamond semiconductor device of the present embodiment works in substantially the same way as the second embodiment. Accordingly, semiconductor conduction dominates as carrier conduction and carriers can be controlled in pn junction, so that the diamond semiconductor device obtains the good diode characteristics as a semiconductor device constituting a two-terminal diode.

Fourth Embodiment

Figure 18:
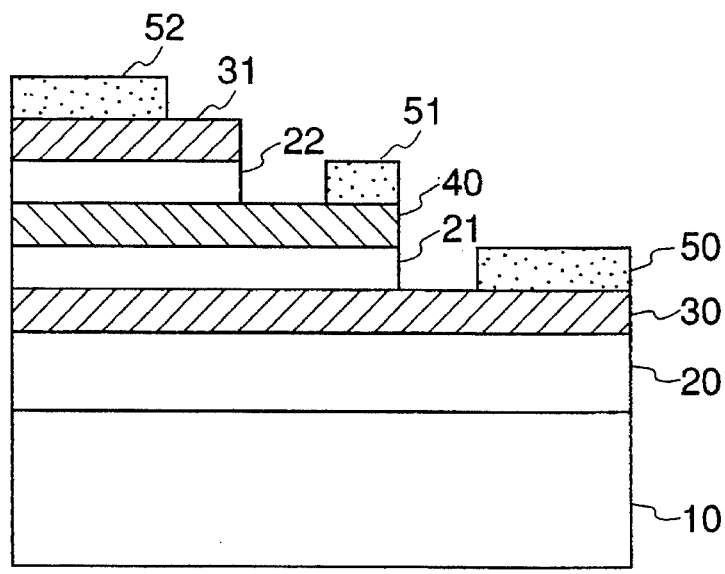
FIG. 18 is a sectional view showing the structure of a diamond semiconductor device according to the fourth embodiment of the present invention.

FIG. 18 is a sectional view showing the structure of a diamond semiconductor device according to the fourth embodiment of the present invention.

An i-type layer 20, an n-type layer 30, an i-type layer 21, a p-type layer 40, an i-type layer 22 and an n-type layer 31 are deposited on a substrate 10 in order by a microplasma CVD method. The i-type layer 21 is grown selectively on a predetermined position of the exposed surface of the n-type layer 30. Further, the i-type layer 22 is grown selectively on a predetermined position of the exposed surface of the p-type layer 40. Furthermore, electrode layers 50, 51 and 52 are grown selectively on a part of the exposed surfaces of the n-type layer 30, the p-type layer 40 and the n-type layer 31, respectively.

Here, the substrate 10, the i-type layers 20 and 21, the n-type layer 30, the p-type layer 40 and the electrode layers 50 and 51 are formed under substantially the same condition as the first embodiment, but the i-type layer 22 is formed under the same condition as the i-type layer 20, and the i-type layer 22 is made of high resistance diamond and has a thickness of 0.2–1 μm. Further, the n-type layer 31 is formed under the same condition as the n-type layer 30, and the n-type layer 31 is made of low resistance diamond and has a thickness of about 1 μm and a nitrogen concentration of $1\times10^{17}\text{cm}^{-3}$ or above, preferably $1\times10^{19}\text{cm}^{-3}$ or above. Furthermore, the electrode layer 52 is made of Ti/Mo/Au under the same condition as the electrode layer 50.

Note that in the i-type layers 20, 21 and 22, the nitrogen concentration and the boron concentration are less than the nitrogen concentration of the n-type layers 30 and 31 and the boron concentration of the p-type layer 40, respectively, and that the distribution of nitrogen and boron does not have to be uniform in a direction of the thickness.

Next, the function of the sixth embodiment will be explained.

The n-type layers 30 and 31 and the p-type layer 40 are formed by doping nitrogen and boron as an n-type dopant and a p-type dopant at high concentration, respectively, so that the donor level and the acceptor level degenerate and are present near the conduction band and the valence band, respectively. Therefore, metal conduction dominates as carrier conduction, so that the low resistance conductivity can be obtained even at room temperature.

Further, the i-type layers 21 and 22 having a predetermined thickness are formed between the n-type layer 30 and the p-type layer 40 and between the p-type layer 40 and the n-type layer 31, respectively. Therefore, semiconductor conduction dominates as carrier conduction and the rectification can be obtained, since the reverse withstand voltage becomes large in these junctions. Accordingly, carriers can be controlled in npn junction, so that the diamond semiconductor device obtains the good transistor characteristics as a semiconductor device constituting a three-terminal bipolar transistor.

Next, the experiment conducted with respect to the fourth embodiment will be explained.

First, the electrical characteristics of the diamond semiconductor device of the fourth embodiment was measured.

Figure 19:
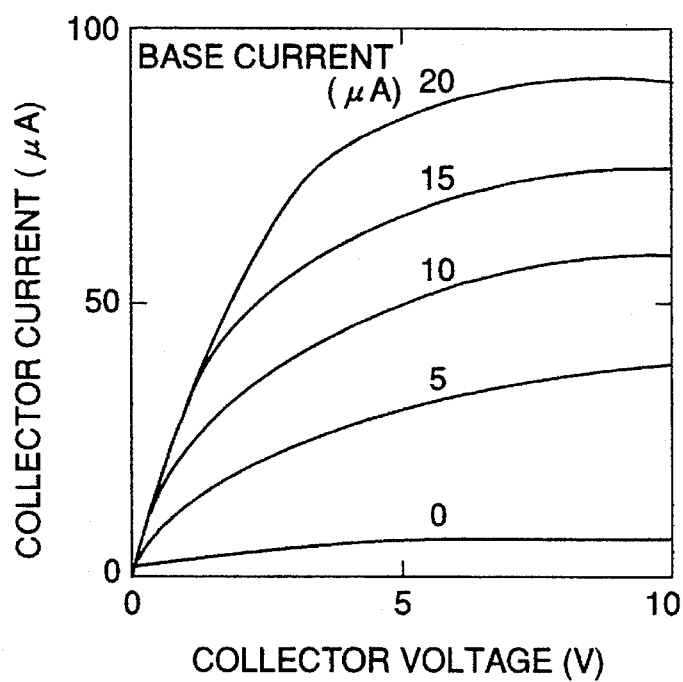
FIG. 19 is a graph showing a transistor characteristic of a diamond semiconductor device of FIG. 18 that is a relation between a collector voltage and a collector current with a base current as a parameter.

FIG. 19 is a graph showing a transistor characteristic of a diamond semiconductor device of FIG. 18 that is a relation between a collector voltage and a collector current with a base current as a parameter.

It can be studied as a result of this mesurement that the collector current is multiplied against the base current, so that the good transistor characteristics can be obtained.

Next, the diamond semiconductor device was formed in the same way as the fourth embodiment except the nitrogen concentration of the n-type layers 30 and 31 and the thickness of the i-type layers 21 and 22 being varied in a certain range. The electrical characteristics were measured. As the thicknesses of the i-type layers 21 and 22 became thinner and the nitrogen concentrations of the n-type layers 30 and 31 became higher, the better transistor characteristics could be obtained, as a result of this mesurement.

Accordingly, when the thickness of the i-type layers 21 and 22 and the nitrogen concentration of the n-type layer 30 and 31 are set to values at which the good diode characteristics are obtained in the first embodiment, the good transistor can be obtained.

Note that in the experiment of the fourth embodiment, in the case that the i-type layers 20–22, the n-type layers 30 and 31 and the p-type layer 40 were made of monocrystalline diamond semiconductor formed on a monocrystalline diamond substrate and in the case that they were made of polycrystalline diamond semiconductor formed on a silicon substrate, the same results were obtained.

Fifth Embodiment

Figure 20:
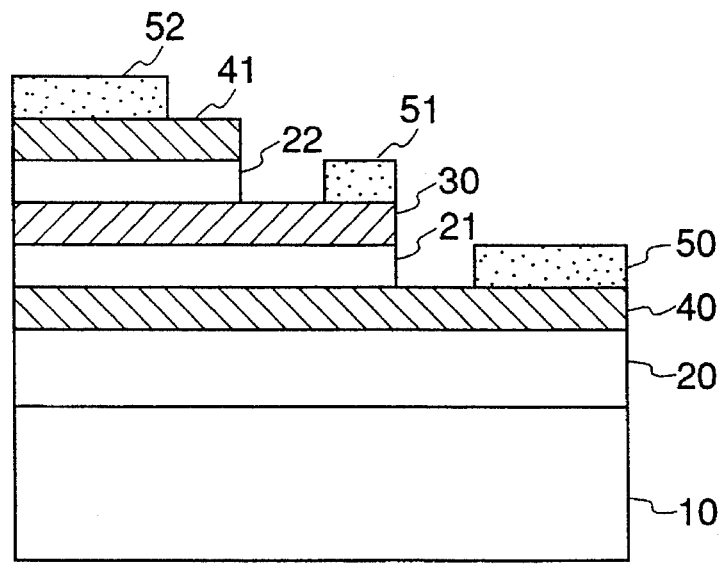
FIG. 20 is a sectional view showing the structure of a diamond semiconductor device according the fifth embodiment of the present invention.

FIG. 20 is a sectional view showing the structure of a diamond semiconductor device according to the fifth embodiment of the present invention.

An i-type layer 20, a p-type layer 40, an i-type layer 21, an n-type layer 30, an i-type layer 22 and a p-type layer 41 are deposited on a substrate 10 in order by a microplasma CVD method. The i-type layer 21 is grown selectively on a predetermined position of the exposed surface of the p-type layer 40. Further, the i-type layer 22 is grown selectively on a predetermined position of the exposed surface of the n-type layer 30. Furthermore, electrode layers 50–52 are grown selectively on the exposed surface of the p-type layer 40, the n-type layer 30 and the p-type layer 41, respectively.

Here, the substrate 10, the i-type layers 20–22, the p-type layer 40, the n-type layer 30 and the electrode layers 50–52 are formed under substantially the same condition as the fourth embodiment, but the p-type layer 41 is formed under the same condition as the p-type layer 40, and the p-type layer 41 is made of low resistance diamond and has a thickness of about 1 µm and a nitrogen concentration of $1 \times 10^{17} cm^{-3}$ or above, preferably $1 \times 10^{19} cm^{-3}$ or above.

Next, the function of the fourth embodiment will be explained.

The n-type layer 30 and the p-type layers 40 and 41 are formed by doping nitrogen and boron as an n-type dopant and a p-type dopant, respectively, so that the donor level and the acceptor level degenerate and are present near the conduction band and the valance band, respectively. Therefore, metal conduction dominates as carrier conduction, so that the low resistance conductivity can be obtained even at room temperature.

Further, the i-type layers 21 and 22 having a predetermined thickness are formed between the p-type layer 40 and the n-type layer 30 and between the n-type layer 30 and the p-type layer 41, respectively. Therefore, the reverse withstand voltage becomes large in these junctions, so that semiconductor conduction dominates as carrier conduction and the rectification can be obtained. Accordingly, carriers can be controlled in pnp junction, so that the diamond semiconductor device obtains the good transistor characteristics as a semiconductor device constituting a three-terminal bipolar transistor.

Next, the experiment conducted with respect to the fifth embodiment will be explained.

First, the electrical characteristics of the diamond semiconductor device of the fifth embodiment were measured.

Figure 21:
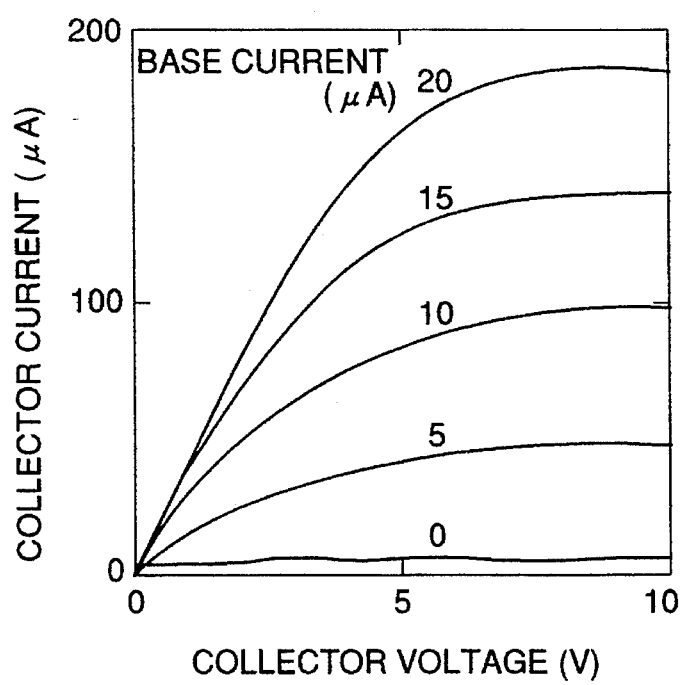
FIG. 21 is a graph showing a transistor characteristic of a diamond semiconductor device of FIG. 20 that is a relation between a collector voltage and a collector current with a base current as a parameter.

FIG. 21 is a graph showing a transistor characteristic of a diamond semiconductor device of FIG. 20 that is a relation between a collector voltage and a collector current with a base current as a parameter.

It can be studied as a result of this mesurement that the collector current is multiplied against the base current, so that the good transistor characteristics can be obtained.

Next, the diamond semiconductor device was formed in the same way as the fifth embodiment except the thickness of the i-type layers 21 and 22 being varied in a certain range, and the electrical characteristics were measured. As the thicknesses of the i-type layers 21 and 22 became thinner and the nitrogen concentrations of the n-type layer 30 became higher, the better transistor characteristics were obtained, as a result of this mesurement.

Accordingly, when the thickness of the i-type layers 21 and 22 and the nitrogen concentration of the n-type layer 30 are set to values at which the good diode characteristics are obtained in the first embodiment, the good transistor can be formed.

Note that in the experiment of the first embodiment, in the case that the i-type layers 20–22, the p-type layers 40 and 41, and the n-type layer 30 were made of monocrystalline diamond semiconductor formed on a monocrystalline diamond substrate and in the case that they were made of polycrystalline diamond semiconductor formed on a silicon substrate, the same results were obtained.

Sixth Embodiment

Figure 22:
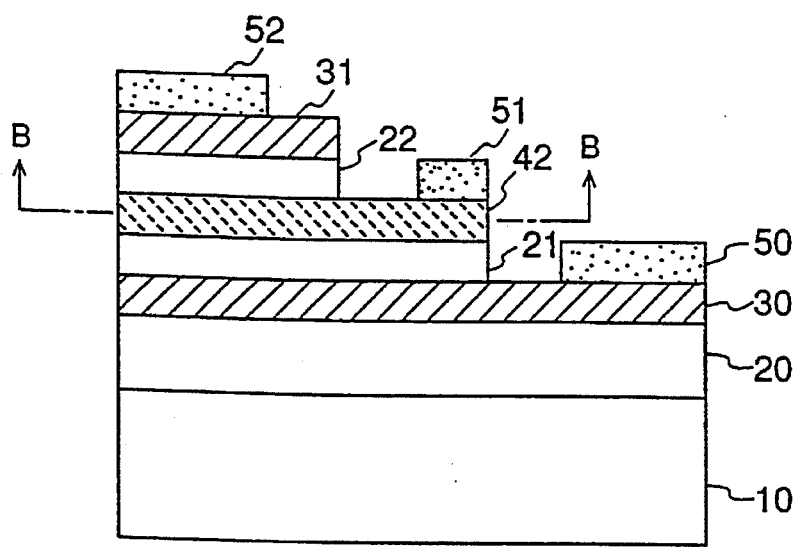
FIG. 22 is a sectional view showing the structure of a diamond semiconductor device according to the sixth embodiment of the present invention.
Figure 23A:
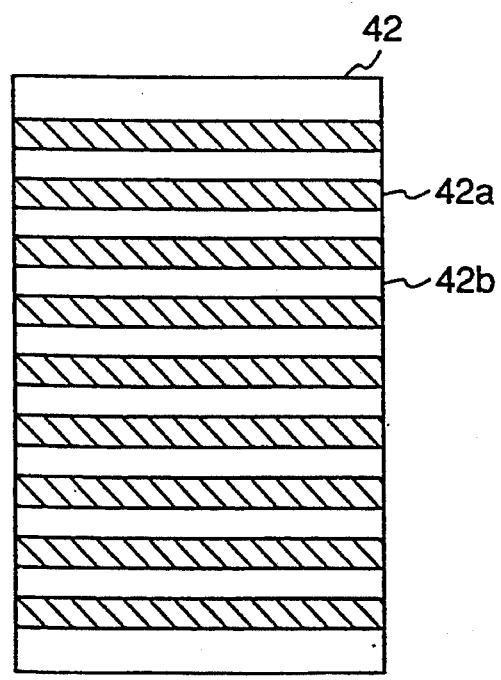
FIG. 23A is a sectional view showing the structure along the lines B—B of FIG. 22.
Figure 23B:
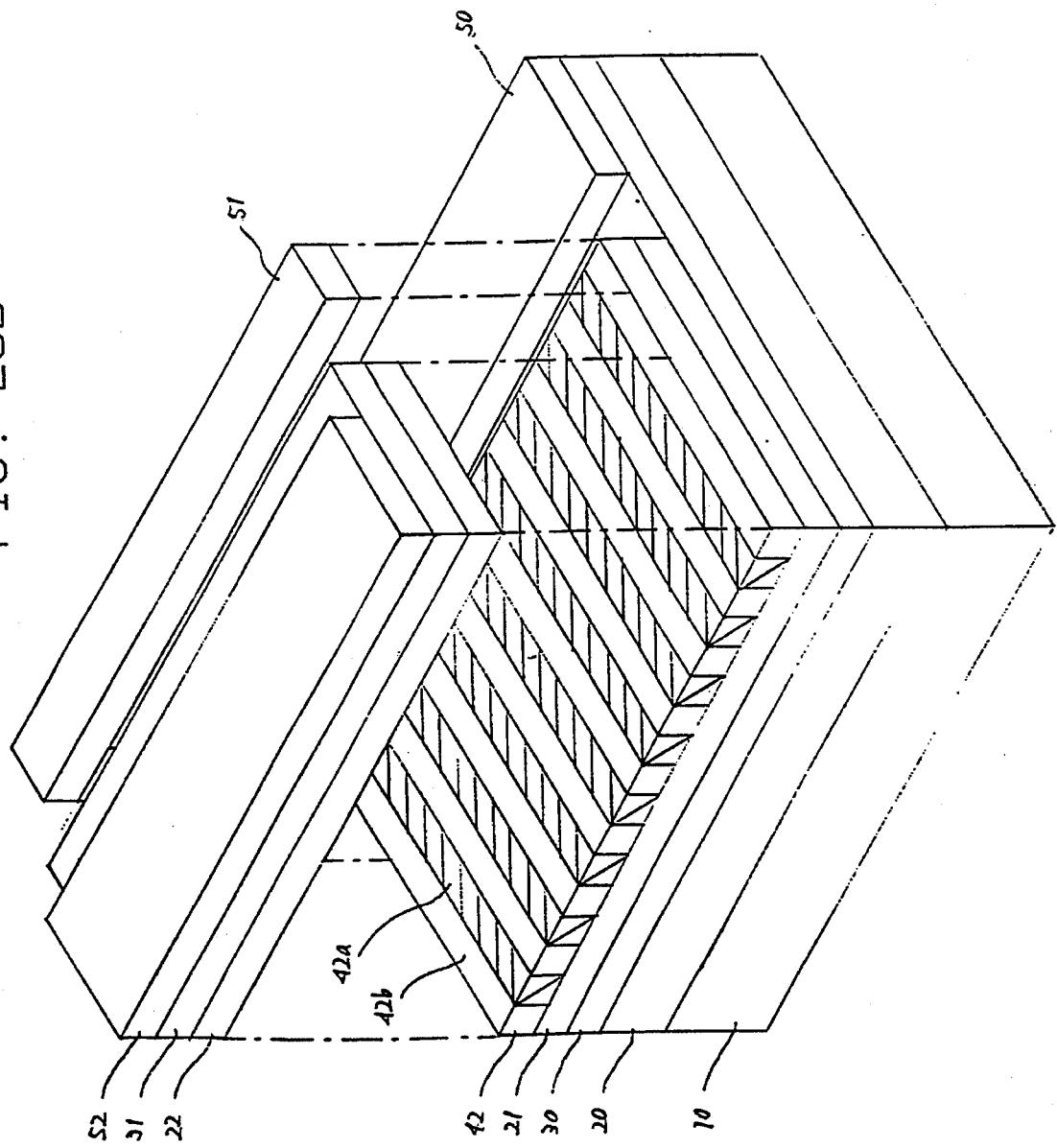
FIG. 23B is a perspective view showing a structure of the diamond semiconductor device shown in FIG. 22.

FIG. 22 is a sectional view showing the structure of a diamond semiconductor device according to the sixth embodiment of the present invention. FIG. 23A is a sectional view showing the structure along the lines B—B of FIG. 22. FIG. 23B is a perspective view showing a structure of the diamond semiconductor device shown in FIG. 22.

An i-type layer 20, an n-type layer 30, an i-type layer 21, a p-type layer 42, an i-type layer 22 and an n-type layer 31 are deposited on a substrate 10 in order by a microplasma CVD method. The i-type layer 21 is grown selectively on a predetermined position of the exposed surface of the n-type layer 30. Further, the i-type layer 22 is grown selectively on a predetermined position of the exposed surface of the p-type layer 42. Furthermore, electrode layers 50–52 are grown selectively on the exposed surfaces of the n-type layer 30, the p-type layer 42 and the n-type layer 31.

Here, the substrate 10, the i-type layers 20 and 21, the n-type layers 30 and 31 and the electrode layers 50, 51 and 52 are formed under substantially the same condition as the fourth embodiment, but the p-type layer 42 is made of low resistance diamond and has a thickness of about 1 µm. In the p-type layer 42, a plurality of rectangular i-type portions 42b are placed in parallel with a certain space under the same condition as the i-type layer 20, and a plurality of rectangular p-type portions 42a are placed between the i-type portions 42b under the same condition as the p-type layer 40.

The p-type portion 42a is made of low resistance diamond having a boron concentration of $1\times10^{17}cm^{-3}$ or above, preferably $1\times10^{19}cm^{-3}$ or above. The i-type portion 42b is made of high resistance diamond having substantially the same nitrogen concentration and the same boron concentration as those of the i-type layers 21 and 22, respectively.

According to the above structure, the diamond semiconductor device of the present embodiment works in the same way as the fourth embodiment. Accordingly, the diamond semiconductor device obtains the transistor characteristics as a semiconductor device constituting a three-terminal SI (static induction) transistor.

Next, the experiment conducted with respect to the sixth embodiment will be explained.

First, the electrical characteristics of the diamond semiconductor device of the sixth embodiment was measured.

Figure 24:
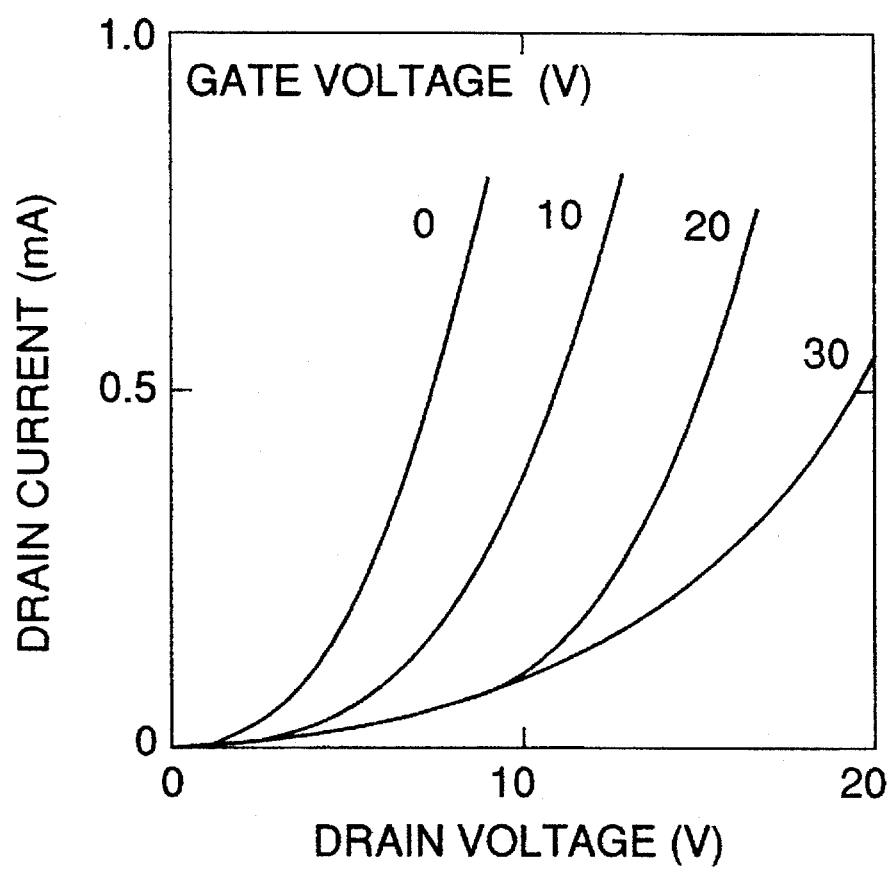
FIG. 24 is a graph showing a transistor characteristic of a diamond semiconductor device of FIG. 22 that is a relation between a drain voltage and a drain current with a gate voltage as a parameter.

FIG. 24 is a graph showing a transistor characteristic of a diamond semiconductor device of FIG. 22 that is a relation between a drain voltage and a drain current with a gate voltage as a parameter.

As the gate voltage becomes large, the drain current is limited, which means that the good transistor characteristics can be obtained, as a result of this mesurement.

Next, the diamond semiconductor device was formed under the same condition as the sixth embodiment except the nitrogen concentration of the n-type layers 30 and 31 and the thickness of the i-type layers 21 and 22 being varied in a certain range, and the electrical characteristics were measured. As the thickness of the i-type layers 21 and 22 became thinner and the nitrogen concentration of the n-type layers 30 and 31 became higher in the certain range, the good transistor characteristics were obtained, as a result of this mesurement. Further, as the space between the p-type portions 42a in the p-type layer 42 became smaller, the good transistor characteristics were obtained.

Accordingly, when the thickness of the i-type layers 21 and 22 and the nitrogen concentration of the n-type layers 30 and 31 are set to values at which the good transistor characteristics are obtained in the first embodiment, the good transistor can be formed.

In the experiment of the sixth embodiment, in the case that the i-type layers 20–22, the n-type layers 30 and 31, and the p-type layer 42 were made of monocrystalline diamond semiconductor formed on a monocrystalline diamond substrate and in the case that they were made of polycrystalline diamond semiconductor formed on a silicon substrate, the same results were obtained.

Seventh Embodiment

Figure 25:
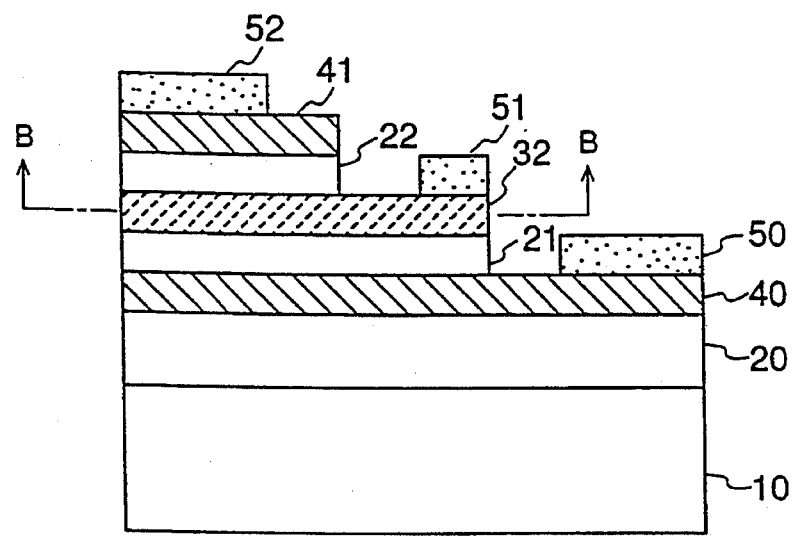
FIG. 25 is a sectional view showing the structure of a diamond semiconductor device according to the seventh embodiment of the present invention.
Figure 26A:
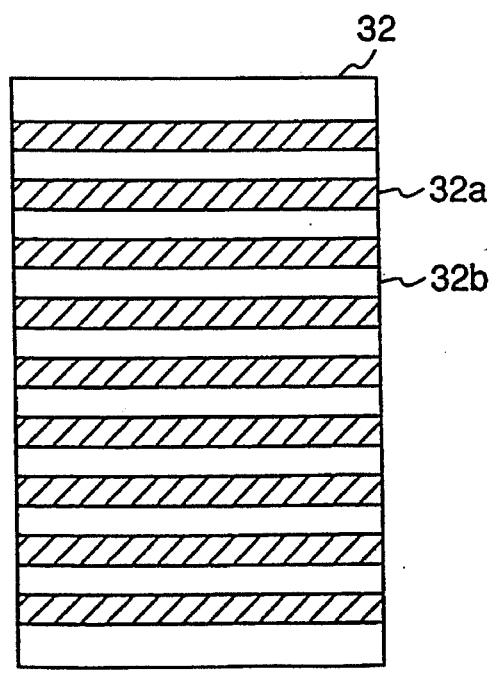
FIG. 26A is a sectional view showing the structure along the lines B—B of FIG. 25.
Figure 26B:
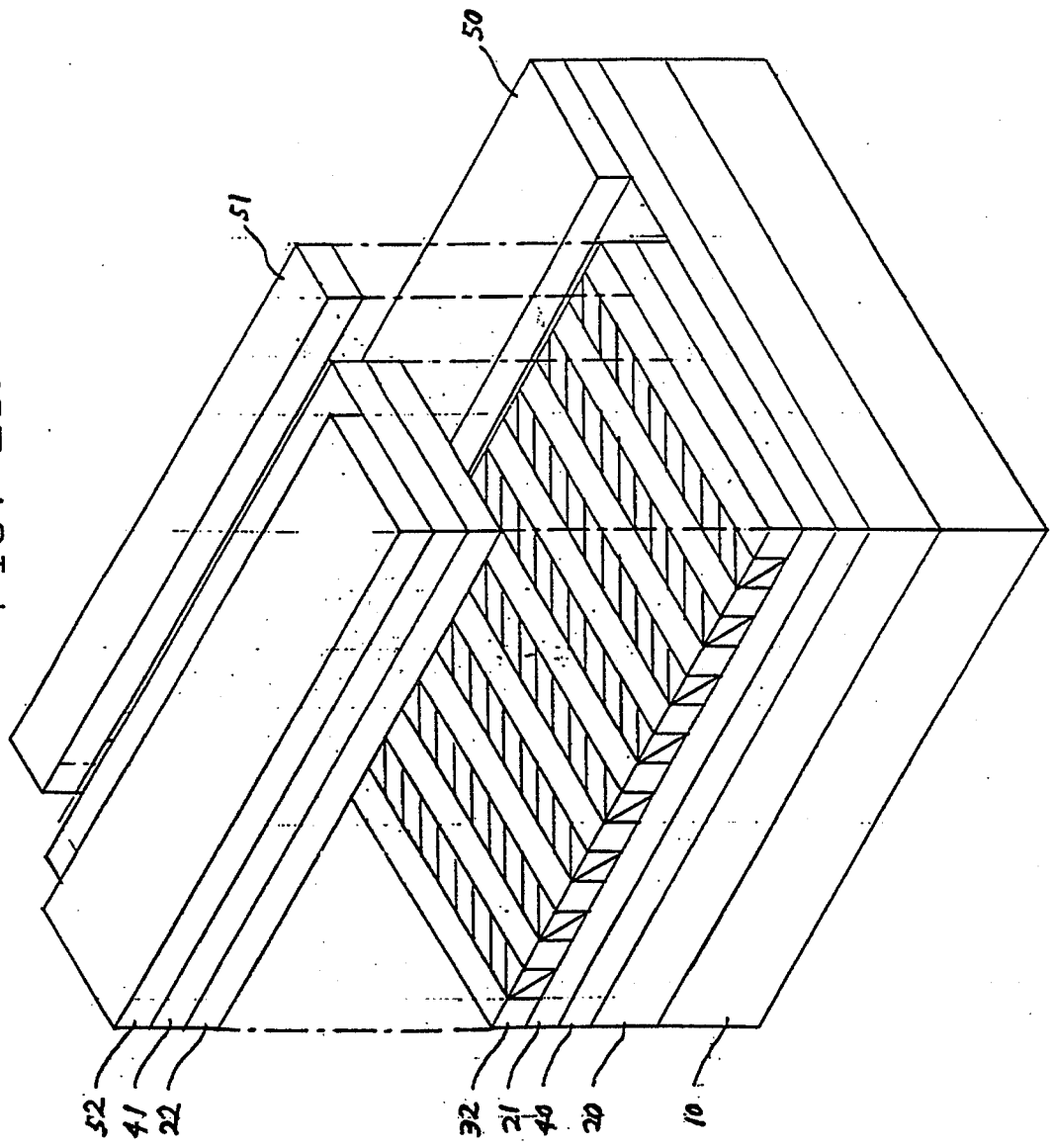
FIG. 26B is a perspective view showing a structure of the diamond semiconductor device shown in FIG. 25.

FIG. 25 is a sectional view showing the structure of a diamond semiconductor device according to the seventh embodiment of the present invention. FIG. 26A is a sectional view showing the structure along the lines B—B of FIG. 25. FIG. 26B is a perspective view showing a structure of the diamond semiconductor device shown in FIG. 25.

An i-type layer 20, a p-type layer 40, an i-type layer 21, an n-type layer 32, an i-type layer 22 and a p-type layer 41 are deposited on a substrate 10 in order by a microplasma CVD. The i-type layer 21 is grown selectively on a predetermined position of the exposed surface of the p-type layer 40. Further, the i-type layer 22 is grown selectively on a predetermined position of the exposed surface of the n-type layer 32. Furthermore, electrodes 50–52 are grown selectively on the exposed surfaces of the p-type layer 40, the n-type layer 32, and the p-type layer 41.

Here, the substrate 10, the i-type layers 20–22, the p-type layers 40 and 41 and the electrodes 50–52 are formed under the same condition as the fifth embodiment, but the n-type layer 32 is made of low resistance diamond having a thickness of 1 μm. In the n-type layer 32, a plurality of rectangular i-type portions 32b are placed in parallel with a certain space under the same condition as the i-type layer 20, and a plurality of rectangular n-type portions 32a are placed between the i-type portions 32b under the same condition as the n-type layer 30.

The n-type portion 32a is made of low resistance diamond having a nitrogen concentration of $1\times10^{17}cm^{-3}$ or above, preferably $1\times10^{19}cm^{-3}$ or above. The i-type portion 32b is made of high resistance diamond having substantially the same nitrogen concentration and the same boron concentration as those of the i-type layers 21 and 22, respectively.

According to the above structure, the diamond semiconductor device of the present embodiment works in the same way as the fifth embodiment. Accordingly, the diamond semiconductor device obtains the transistor characteristics as a semiconductor device constituting a three-terminal SI (static induction) transistor.

Next, the experiment conducted with respect to the seventh embodiment will be explained.

First, the electrical characteristics of the diamond semiconductor device of the seventh embodiment were measured.

Figure 27:
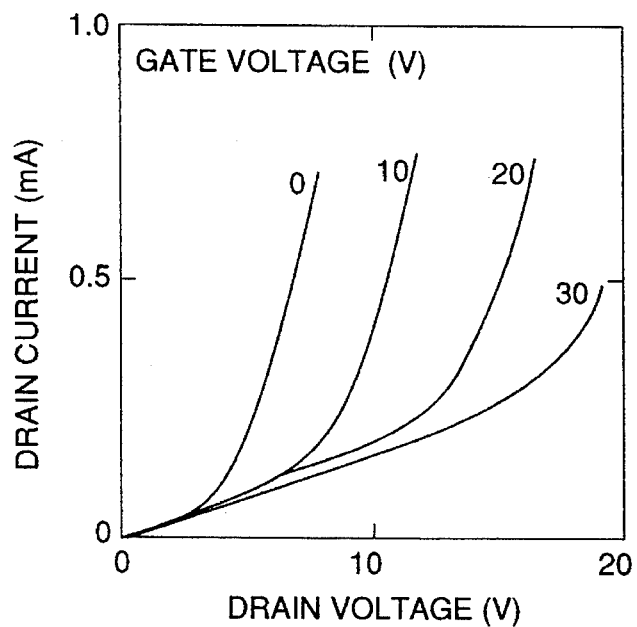
FIG. 27 is a graph showing a transistor characteristic of a diamond semiconductor device of FIG. 25 that is a relation between a drain voltage and a drain current with a gate voltage as a parameter.

FIG. 27 is a graph showing a transistor characteristic of a diamond semiconductor device of FIG. 25 that is a relation between a drain voltage and a drain current with a gate voltage as a parameter.

As the gate voltage becomes large, the drain current is limited, which means that the good transistor characteristics can be obtained, as a result of this mesurement.

Next, the diamond semiconductor device was formed under the same condition as the seventh embodiment except the nitrogen concentration of the n-type layer 32 and the thicknesses of the i-type layers 21 and 22 being varied in a certain range, and the electrical characteristics were measured. As the thicknesses of the i-type layers 21 and 22 became thinner and the nitrogen concentration of the n-type layer 32 became higher in the certain range, the good transistor characteristics were obtained, as a result of this mesurement. Further, as the space between the n-type portions 32a in the n-type layer 32 became smaller, the good transistor characteristics were obtained.

Accordingly, when the thicknesses of the i-type layers 21 and 22 and the nitrogen concentration of the n-type layer 32 are set to values at which the good diode characteristics are obtained in the first embodiment, the good transistor can be formed.

Note that in the experiment of the seventh embodiment, in the case that the i-type layers 20–22, the p-type layers 40 and 41 and the n-type layer 32 were made of monocrystalline diamond semiconductor formed on a monocrystalline diamond substrate and in the case that they were made of polycrystalline diamond semiconductor formed on a silicon substrate, the same results were obtained.

Eighth Embodiment

Figure 28:
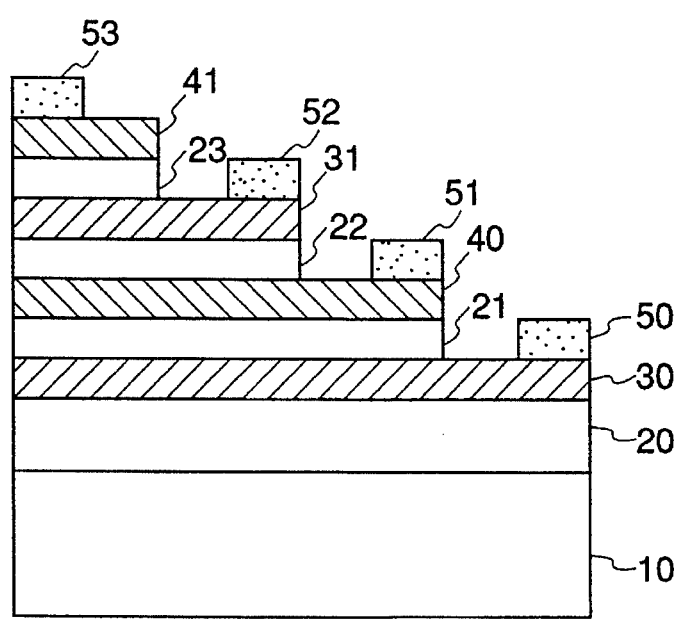
FIG. 28 is a sectional view showing the structure of a diamond semiconductor device according to the eighth embodiment of the present invention.

FIG. 28 is a sectional view showing the structure of a diamond semiconductor device according to the eighth embodiment of the present invention.

An i-type layer 20, an n-type layer 30, an i-type layer 21, a p-type layer 40, an i-type layer 22, an n-type layer 31, an i-type layer 23 and a p-type layer 41 are deposited on a substrate 10 in order by a microplasma CVD method. The i-type layer 21 is grown selectively on a predetermined position of the exposed surface of the n-type layer 30. Further, the i-type layer 22 is grown selectively on a predetermined position of the exposed surface of the p-type layer 42. The i-type layer 23 is grown selectively on a predetermined position of the exposed surface of the n-type layer 31. Furthermore, electrodes 50–53 are grown selectively on the exposed surfaces of the n-type layer 30, the p-type layer 40, the n-type layer 31, and the p-type layer 41.

Here, the substrate 10, the i-type layers 20 and 21, the n-type layers 30 and 31, the p-type layer 40 and the electrode layers 50–52 are formed under the same condition as the sixth embodiment, but the i-type layer 23 is made of high resistance diamond having a thickness of 0.2–1 μm under the same condition as the i-type layer 20. Further, the p-type layer 41 is made of low resistance diamond having a thickness of about 1 μm under the same condition as the n-type layer 30. Furthermore, the electrode layer 53 is made of Ti/Mo/Au under the same condition as the electrode layer 50.

Note that in the i-type layers 20–23, the nitrogen concentration and the boron concentration are less than the nitrogen concentration of the n-type layers 30 and 31 and the boron concentration of the p-type layers 40 and 41, respectively, and that distribution of nitrogen and boron does not have to be uniform.

Next, the function of the eighth embodiment will be explained.

The n-type layers 30 an 31 and the p-type layers 40 and 41 are formed by doping nitrogen and boron as an n-type dopant and a p-type dopant, resctively, so that the donor level and the acceptor level degenerate and are present near the conduction band the valance band, respectively. Therefore, metal conduction dominates as carrier conduction, so that the low resistance conductivity can be obtained even at room temperature.

Further, the i-type layers 21–23 having a predetermined thickness are formed between the n-type layer 30 and the p-type layer 40, between the p-type layer 40 and the n-type layer 31 and between the n-type layer 31 and the p-type layer 41, respectively. Therefore, the reverse withstand voltage becomes large in these junctions, so that semiconductor conduction dominates as carrier conduction and the rectification can be obtained. Accordingly, carriers can be controlled in npnp junction, so that the diamond semiconductor device obtains the good thyristor characteristics as a semiconductor device constituting a four-terminal thyristor.

Next, the experiment conducted with respect to the eighth embodiment will be explained.

First, the electrical characteristics of the diamond semiconductor device of the eighth embodiment were measured.

Figure 29:
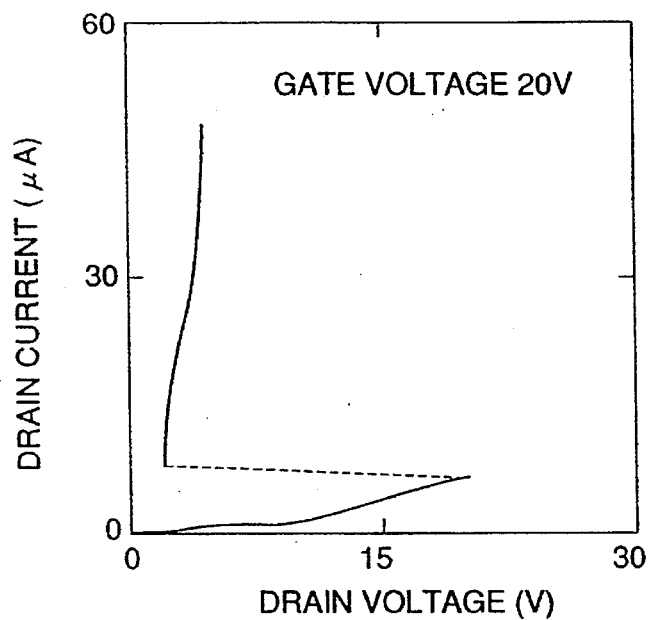
FIG. 29 is a graph showing a thyristor characteristic of a diamond semiconductor device of FIG. 28 that is a relation between a diamond semiconductor device in a drain voltage and a drain current in a case of a constant gate voltage.

FIG. 29 is a graph showing a thyristor characteristic of a diamond semiconductor device of FIG. 28 that is a relation between a drain voltage and a drain current with a constant gate voltage.

The drain current has a switching property based on the drain voltage, which means that the good thyristor characteristics can be obtained, as a result of this mesurement.

Next, the diamond semiconductor device was formed under the same condition as the eighth embodiment except the nitrogen concentration of the n-type layers 30 and 31 and the thickness of the i-type layers 21 and 22 being varied in a certain range, and the electrical characteristics were measured. As the thickness of the i-type layers 21–23 became thinner and the nitrogen concentration of the n-type layers 30 and 31 became higher in the certain range, the good thyristor characteristics were obtained, as a result of this mesurement.

Accordingly, when the thickness of the i-type layers 21–23 and the nitrogen concentration of the n-type layers 30 and 31 are set to values at which the good diode characteristics are obtained in the first embodiment, the good thyristor can be formed.

Note that in the experiment of the eighth embodiment, in the case that the i-type layers 20–22, the n-type layers 30 and 31 and the p-type layers 40 and 41 were made of monocrystalline diamond semiconductor formed on a monocrystalline diamond substrate and in the case that they were made of polycrystalline diamond semiconductor formed on a silicon substrate, the same results were obtained.

Ninth Embodiment

Figure 30:
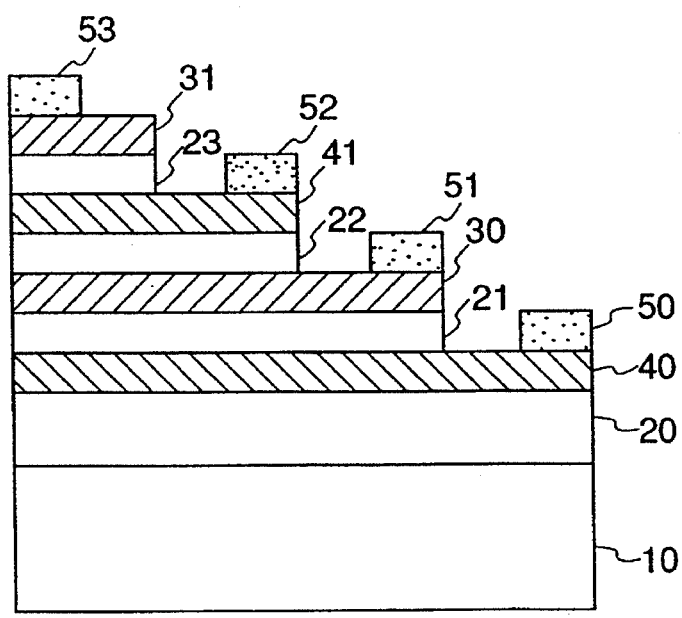
FIG. 30 is a sectional view showing the structure of a diamond semiconductor device according to the ninth embodiment of the present invention.

FIG. 30 is a sectional view showing the structure of a diamond semiconductor device according to the ninth embodiment of the present invention.

An i-type layer 20, a p-type layer 40, an i-type layer 21, an n-type layer 30, an i-type layer 22, a p-type layer 41, an i-type layer 23 and an n-type layer 31 are deposited on a substrate 10 in order by a microplasma CVD method. The i-type layer 21 is grown selectively on a predetermined position of the exposed surface of the p-type layer 40. Further, the i-type layer 22 is grown selectively on a predetermined position of the exposed surface of the n-type layer 30. The i-type layer 23 is grown selectively on a predetermined position of the exposed surface of the p-type layer 41. Furthermore, electrode layers 50–53 are grown selectively on the exposed surfaces of the p-type layer 40, the n-type layer 30, the p-type layer 41, and the n-type layer 31.

Here, the substrate 10, the i-type layers 20–22, the p-type layers 40 and 41, and the n-type layer 30 are formed under the same condition as the seventh embodiment, but the i-type layer 23 is made of high resistance diamond having a thickness of 0.2–1 μm under the same condition as the i-type layer 20. Further, the n-type layer 31 is made of low resistance diamond having a thickness of about 1 μm under the same condition as the n-type layer 30. Furthermore, the electrode layer 53 is made of Ti/Mo/Au under the same condition as the electrode layer 50.

Note that in the i-type layers 20–23, the nitrogen concentration and the boron concentration are less than the nitrogen concentration of the n-type layers 30 and 31 and the boron concentration of the p-type layers 40 and 41, respectively, and that distribution of nitrogen and boron does not have to be uniform.

According to the above structure, the diamond semiconductor device of the present embodiment works in the same way as the eighth embodiment. Accordingly, the diamond semiconductor device obtains the thyristor characteristics as a semiconductor device constituting a four-terminal thyristor.

Next, the experiment conducted with respect to the ninth embodiment will be explained.

First, the electrical characteristics of the diamond semiconductor device of the ninth embodiment were measured.

Figure 31:
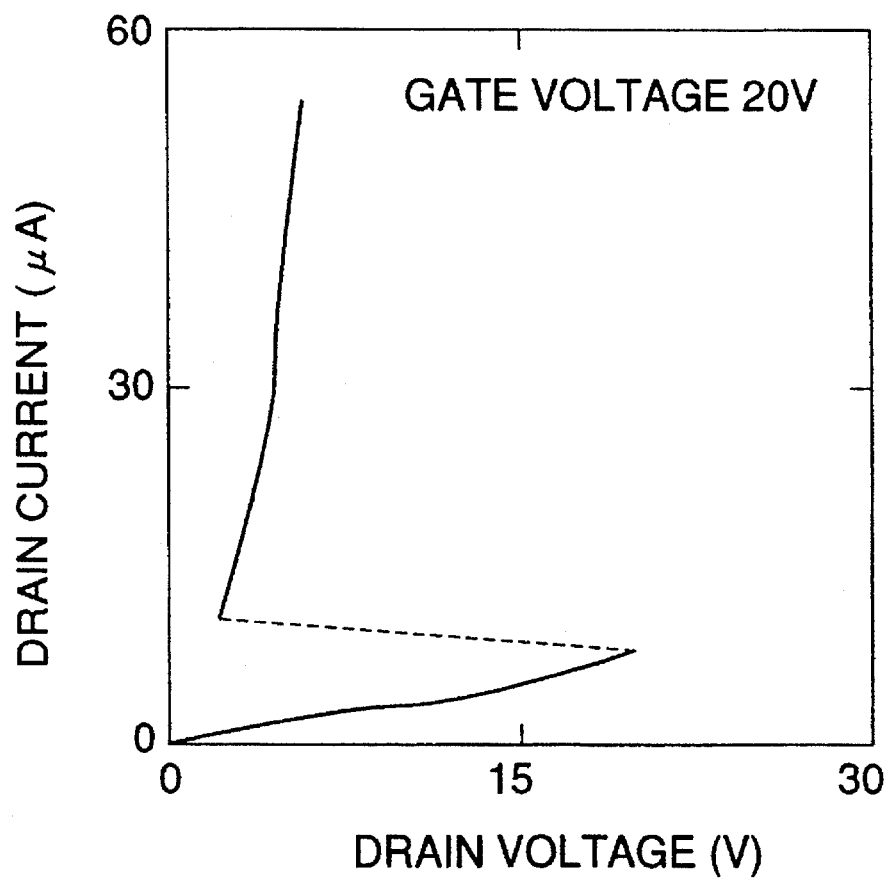
FIG. 31 is a graph showing a thyristor characteristic of a diamond semiconductor device of FIG. 30 that is a relation between a drain voltage and a drain current in a case of a constant gate voltage.

FIG. 31 is a graph showing a thyristor charactoristic of a diamond semiconductor device of FIG. 30 that is a relation between a drain voltage and a drain current with a constant gate voltage.

It can be studied as a result of this mesurement that the drain current has a switching property based on the drain voltage, which means that the good thyristor characteristics can be obtained.

Next, the diamond semiconductor device was formed under the same condition as the ninth embodiment except the nitrogen concentration of the n-type layers 30 and 31 and the thickness of the i-type layers 21 and 22 being varied in a certain range, and the electrical characteristics were measured. As the thickness of the i-type layers 21–23 became thinner and the nitrogen concentration of the n-type layers 30 and 31 became higher in the certain range, the good thyristor characteristics were obtained, as a result of this mesurement.

Accordingly, when the thickness of the i-type layers 21–23 and the nitrogen concentration of the n-type layers 30 and 31 are set to values at which the good diode characteristics are obtained in the first embodiment, the good thyristor can be formed.

Note that in the experiment of the ninth embodiment, in the case that the i-type layers 20–22, the p-type layers 40 and 41 and the n-type layers 30 and 31 were made of monocrystalline diamond semiconductor formed on a monocrystalline diamond substrate and in the case that they were made of polycrystalline diamond semiconductor formed on a silicon substrate, the same results were obtained.

The present invention is not limited to the above embodiments, and the various modifications can be made.

For example, in the above embodiments, the nitrogen concentration and the boron concentration distribute uniformly in the i-type layer formed between the n-type layer and the p-type layer, but the doping concentration can be distributed obliquely in a direction of thickness, or the dopant can be distributed nonuniformly as if a plurality of layers having a different doping concentration are deposited. Further, the i-type layer can be made of non-doped diamond having a very low nitrogen concentration and a boron concentration.

In the above embodiments, the diamond semiconductor layers having a different conduction type is a vapor-synthesized monocrystalline thin film (epitaxial layer), but in either case of an artificial bulk monocrystal synthesized by high pressure and a vapor-synthesized polycrystalline thin film, the same function and effects can be obtained. However, in a view of the controllability in the semiconductor device manufacturing process, it is preferable to use a monocrystalline substrate or a thin film monocrystal vapor-synthesized on a polycrystalline substrate having a polished flat surface by a CVD method.

In the above embodiments, the diamond semiconductor layers having a different conduction type is formed by a plasma CVD method, but with the following CVD methods, the same functions and effects can be obtained. The first method is to activate material gas by discharging in DC electrical field or AC electrical field. The second method is to activate material gas by heating thermoelectric material. The third method is to grow diamond on a surface struck by ions. The fourth method is to excite material gas by irradiating with light such as a laser or an ultra violet ray. The fifth method is to burn material gas.

In the above embodiments, the n-type layer is formed by doping nitrogen in diamond by a CVD method, but it can be formed by adding a material containing carbon, a material containing nitrogen and solvent into a high-pressure-synthesizing container and using a high pressure synthesizing method, which results in the same function and effects.

Further in the above embodiments, the substrate is an insulating substrate made of monocrystalline diamond or a semiconductor substrate made of silicon, but an insulating substrate and a semiconductor substrate can be made of another material. Further, the substrate can be made of metal.

Thus, as described above, according to the present invention, since the n-type dopant and the p-type dopant are doped to the n-type diamond layer and the p-type diamond layer at high concentration, respectively, the donor level and the acceptor level degenerate, so that metal conduction dominates as carrier conduction.

The high resistance diamond layer having a predetermined thickness and a predetermined doping concentration is formed between the n-type diamond layer and the p-type diamond layer, which makes the reverse withstand voltage larger, so that semiconductor conduction dominates in pn junction as carrier conduction and the rectification can be obtained. Therefore, carriers can be controlled in pn junction, so that good diode characteristics or transistor characteristics can be achieved.

As described above, carrier density in the n-type diamond layer and the p-type diamond is controlled in a range from room temperature to around 600° C., independent from temperature. Accordingly, an advantage of the diamond semiconductor device of the present invention is possible to use as a semiconductor device such as a diode, a transistor or others in a condition that electronic apparatus constituted with the conventional silicon semiconductors cannot be used.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No. 226235/1993 filed on Sep. 10, 1993 is hereby incorporated by reference.

What is claimed is:

1. A diamond semiconductor device comprising:

a first n-type diamond layer to which an n-type dopant is doped at high concentration so that metal conduction dominates;

a first p-type diamond layer to which a p-type dopant is doped at high concentration so that metal conduction dominates; and a first high resistance diamond layer formed between said first n-type diamond layer and said first p-type diamond layer and having values of a thickness and a doping concentration at which semiconductor conduction dominates between said first n-type diamond layer and said first p-type diamond layer, wherein n-type dopant of said first n-type diamond layer is nitrogen; and the thickness of said first high resistance diamond layer is within a range of 30–3000 nm.

2. A diamond semiconductor device according to claim 1, wherein the nitrogen dopant concentration of said first n-type diamond layer is $1 \times 10^{17}$ cm$^{-3}$ or above; and a nitrogen concentration of said first high resistance diamond layer is less than $1 \times 10^{17}$ cm$^{-3}$.

3. A diamond semiconductor device according to claim 1, wherein the nitrogen dopant concentration of said first n-type diamond layer is $1\times10^{19}$ cm$^{-3}$ or above; and a nitrogen concentration of said first high resistance diamond layer is less than $1\times10^{19}$ cm$^{-3}$.

4. A diamond semiconductor device according to claim 1, wherein the p-type dopant of said first p-type diamond layer is boron; the boron dopant concentration of said first p-type diamond layer is $1\times10^{17}$ cm$^{-3}$ or above; and a boron concentration of said first high resistance diamond layer is less than $1\times10^{17}$ cm$^{-3}$.

5. A diamond semiconductor device according to claim 1, wherein the p-type dopant of said first p-type diamond layer is boron; the boron dopant concentration of said first p-type diamond layer is $1\times10^{19}$ cm$^{-3}$ or above; and a boron concentration of said first high resistance diamond layer is less than $1\times10^{19}$ cm$^{-3}$.

6. A diamond semiconductor device according to claim 1, further comprising:

a second n-type diamond layer to which an n-type dopant is doped at high concentration so that metal conduction dominates; and a second high resistance diamond layer formed between said first p-type diamond layer and said second n-type diamond layer, opposed to said first high resistance diamond layer with respect to said first p-type diamond layer, and having values of a thickness and a doping concentration at which semiconductor conduction dominates between said first p-type diamond layer and said second n-type diamond layer.

7. A diamond semiconductor device according to claim 6, wherein said first p-type diamond layer comprises a plurality of rectangular i-type portions placed in parallel along a surface direction of said first p-type diamond layer and substantially having the same doping concentration as that of said first and second high resistance diamond layers, and a plurality of rectangular p-type portions which are placed between said plurality of rectangular i-type portions and to which the p-type dopant is doped at high concentration so that metal conduction dominates.

8. A diamond semiconductor device according to claim 6, wherein the nitrogen dopant concentrations of said first and second n-type diamond layers are $1\times10^{17}$ cm$^{-3}$ or above; and nitrogen concentrations of said first and second high resistance diamond layers are less than $1\times10^{17}$ cm$^{-3}$.

9. A diamond semiconductor device according to claim 6, wherein the nitrogen dopant concentrations of said first and second n-type diamond layers are $1\times10^{19}$ cm$^{-3}$ or above; and nitrogen concentrations of said first and second high resistance diamond layers are less than $1\times10^{19}$ cm$^{-3}$.

10. A diamond semiconductor device according to claim 6, wherein the p-type dopant of said first p-type diamond layer is boron; the boron dopant concentration of said first p-type diamond layer is $1\times10^{17}$ cm$^{-3}$ or above; and boron concentrations of said first and second high resistance diamond layers are less than $1\times10^{17}$ cm$^{-3}$.

11. A diamond semiconductor device according to claim 6, wherein the p-type dopant of said first p-type diamond layer is boron; the boron dopant concentration of said first p-type diamond layer is $1\times10^{19}$ cm$^{-3}$ or above; and boron concentrations of said first and second high resistance diamond layers are less than $1\times10^{19}$ cm$^{-3}$.

12. A diamond semiconductor device according to claim 1, further comprising:

a second p-type diamond layer to which a p-type dopant is doped at high concentration so that metal conduction dominates; and a second high resistance diamond layer formed between said first n-type diamond layer and said second p-type diamond layer, opposed to said first high resistance diamond layer with respect to said first n-type diamond layer, and having values at a thickness and a doping concentration at which semiconductor conduction dominates between said first n-type diamond layer and said second p-type diamond layer.

13. A diamond semiconductor device according to claim 12, wherein said first n-type diamond layer comprises a plurality of rectangular i-type portions placed in parallel along a surface direction of said first n-type diamond layer and substantially having the same doping concentration as that of said first and second high resistance diamond layer, and a plurality of rectangular n-type portions which are placed between said plurality of rectangular i-type portions and to which the n-type dopant is doped at high concentration so that metal conduction dominates.

14. A diamond semiconductor device according to claim 12, wherein the nitrogen dopant concentration of said first n-type diamond layer is $1\times10^{17}$ cm$^{-3}$ or above; and nitrogen concentrations of said first and second high resistance diamond layers are less than $1\times10^{17}$ cm$^{-3}$.

15. A diamond semiconductor device according to claim 12, wherein the nitrogen dopant concentration of said first n-type diamond layer is $1\times10^{19}$cm$^{-3}$ or above; and nitrogen concentrations of said first and second high resistance diamond layers are less than $1\times10^{19}$ cm$^{-3}$.

16. A diamond semiconductor device according to claim 12, wherein the p-type dopants of said first and second p-type diamond layers are boron; the boron dopant concentrations of said first and second p-type diamond layers are $1\times10^{17}$ cm$^{-3}$ or above; and boron concentrations of said first and second high resistance diamond layers are less than $1\times10^{17}$ cm$^{-3}$.

17. A diamond semiconductor device according to claim 12, wherein the p-type dopants of said first and second p-type diamond layers are boron; the boron dopant concentrations of said first and second p-type diamond layers are $1\times10^{19}$ cm$^{-3}$ or above; and boron concentrations of said first and second high resistance diamond layers are less than $1\times10^{19}$ cm$^{-3}$.

18. A diamond semiconductor device according to claim 1, further comprising:

a second n-type diamond layer to which an n-type dopant is doped at high concentration so that metal conduction dominates;

a second high resistance diamond layer formed between said first p-type diamond layer and said second n-type diamond layer, opposed to said first high resistance diamond layer with respect to said first p-type diamond layer, and having values at a thickness and a doping concentration at which semiconductor conduction dominates between said first p-type diamond layer and said second n-type diamond layer;

a second p-type diamond layer to which a p-type dopant is dopant at high concentration so that metal conduction dominates; and a third high resistance diamond layer formed between said first n-type diamond layer and said second p-type diamond layer, opposed to said first high resistance diamond layer with respect to said first n-type diamond layer, and having values of a thickness and a doping concentration at which semiconductor conduction dominates between said first n-type diamond layer and said second p-type diamond layer.

19. A diamond semiconductor device according to claim 18, wherein the nitrogen dopant concentrations of said first and second n-type diamond layers are $1\times10^{17}$ cm$^{-3}$ or above; and nitrogen concentrations of said first to third high resistance diamond layers are less than $1\times10^{17}$ cm$^{-3}$.

20. A diamond semiconductor device according to claim 18, wherein the nitrogen dopant concentrations of said first and second n-type diamond layers are $1\times10^{19}$ cm$^{-3}$ or above; and nitrogen concentrations of said first to third high resistance diamond layers are less than $1\times10^{19}$ cm$^{-3}$.

21. A diamond semiconductor device according to claim 18, wherein the p-type dopants of said first and second p-type diamond layers are boron; the boron dopant concentrations of said first and second p-type diamond layers are $1\times10^{17}$ cm$^{-3}$ or above; and boron concentrations of said first to third high resistance diamond layers are less than $1\times10^{17}$ cm$^{-3}$.

22. A diamond semiconductor device according to claim 18, wherein the p-type dopants of said first and second p-type diamond layers are boron; the boron dopant concentrations of said first and second p-type diamond layers are $1\times10^{19}$ cm$^{-3}$ or above; and boron concentrations of said first to third high resistance diamond layers are less than $1\times10^{19}$ cm$^{-3}$.

* * * * *